(12) United States Patent
North et al.

(10) Patent No.: US 11,079,816 B1
(45) Date of Patent: Aug. 3, 2021

(54) SYSTEM AND METHOD FOR VAPOR CHAMBER DIRECTIONAL HEAT DISSIPATION FOR A PIEZOELECTRIC KEYBOARD ASSEMBLY

(71) Applicant: Dell Products, LP, Round Rock, TX (US)

(72) Inventors: Travis C. North, Cedar Park, TX (US); Michiel Knoppert, Amsterdam (NL); Priyank Gajiwala, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 16/779,523

(22) Filed: Jan. 31, 2020

(51) Int. Cl.
*G06F 1/20* (2006.01)
*H01L 41/053* (2006.01)
(Continued)

(52) U.S. Cl.
CPC ............ *G06F 1/203* (2013.01); *G06F 1/1662* (2013.01); *G06F 3/016* (2013.01); *G06F 3/0202* (2013.01);
(Continued)

(58) Field of Classification Search
CPC ... G06F 1/1662; G06F 1/203; G06F 2200/201
See application file for complete search history.

(56) References Cited

U.S. PATENT DOCUMENTS 4,618,797 A 10/1986 Cline
4,857,887 A 8/1989 Iten
(Continued)

FOREIGN PATENT DOCUMENTS

JP 2014164610 A 9/2014
KR 100442116 B1 7/2004
(Continued)

OTHER PUBLICATIONS

Rekimoto, J., et al., "PreSensell: Bi-directional Touch and Pressure Sensing Interactions with Tactile Feedback," Apr. 2006, 6 pages.
(Continued)

*Primary Examiner* — Mukundbhai G Patel
(74) *Attorney, Agent, or Firm* — Prol Intellectual Property Law, PLLC; H. Kenneth Prol

(57) ABSTRACT

An integrated heat dissipation system for a haptic piezoelectric keyboard of an information handling system comprising a base chassis formed of a C-cover affixed to a D-cover to house the haptic piezoelectric keyboard assembly, a processor, and a heat dissipating layer and the heat dissipating layer thermally coupled to a haptic piezoelectric keyboard assembly and the processor to direct heat away from the keys of the piezoelectric keyboard of the C-cover and toward a vertical edge of the base chassis, where the piezoelectric keyboard assembly comprises a plurality of piezoelectric sensors disposed across a support plate, and a contact foil layer, for detecting deformation of one of the plurality of piezoelectric sensors and registering a keystroke, affixed to the plurality of piezoelectric sensors and the support plate and provide a haptic feedback control signal to generate a haptic response to the keys of the piezoelectric keyboard.

20 Claims, 10 Drawing Sheets

(51) Int. Cl.
  *H01L 41/113* (2006.01)
  *H01L 41/047* (2006.01)
  *H05K 7/20* (2006.01)
  *G06F 1/16* (2006.01)
  *G06F 3/01* (2006.01)
  *G06F 3/02* (2006.01)
  *H01L 41/25* (2013.01)

(52) U.S. Cl.
  CPC .......... *H01L 41/047* (2013.01); *H01L 41/053* (2013.01); *H01L 41/1132* (2013.01); *H01L 41/25* (2013.01); *H05K 7/20154* (2013.01); *H05K 7/20172* (2013.01); *H05K 7/20336* (2013.01); *G06F 2200/201* (2013.01)

(56) References Cited

U.S. PATENT DOCUMENTS

| | | |
|---|---|---|
| 5,463,388 A | 10/1995 | Boie |
| 5,825,352 A | 10/1998 | Bisset |
| 5,861,583 A | 1/1999 | Schediwy |
| 5,887,995 A | 3/1999 | Holehan |
| 6,147,680 A | 11/2000 | Tareev |
| 6,188,391 B1 | 2/2001 | Seely |
| 6,239,790 B1 | 5/2001 | Martinelli |
| 6,532,824 B1 | 3/2003 | Ueno |
| 6,574,095 B2 | 6/2003 | Suzuki |
| 6,680,731 B2 | 1/2004 | Gerpheide |
| 6,703,550 B2 | 3/2004 | Chu |
| 6,822,635 B2 | 11/2004 | Shahoian |
| 6,882,337 B2 | 4/2005 | Sheffer |
| 7,336,260 B2 | 2/2008 | Martin |
| 7,439,962 B2 | 10/2008 | Reynolds |
| 7,486,279 B2 | 2/2009 | Wong |
| 7,523,410 B2 | 4/2009 | Rekimoto |
| 7,535,454 B2 | 5/2009 | Jasso |
| 7,741,979 B2 | 6/2010 | Schlosser |
| 7,808,488 B2 | 10/2010 | Martin |
| 8,144,453 B2 | 3/2012 | Brown |
| 8,159,461 B2 | 4/2012 | Martin |
| 8,164,573 B2 | 4/2012 | DaCosta |
| 8,199,033 B2 | 6/2012 | Peterson |
| 8,248,277 B2 | 8/2012 | Peterson |
| 8,248,278 B2 | 8/2012 | Schlosser |
| 8,279,052 B2 | 10/2012 | Heubel |
| 8,294,600 B2 | 10/2012 | Peterson |
| 8,294,677 B2 | 10/2012 | Wu |
| 8,373,664 B2 | 2/2013 | Wright |
| 8,477,113 B2 | 7/2013 | Wu |
| 8,508,487 B2 | 8/2013 | Schwesig |
| 8,542,134 B2 | 9/2013 | Peterson |
| 8,581,710 B2 | 11/2013 | Heubel |
| 8,633,916 B2 | 1/2014 | Bernstein |
| 8,674,941 B2 | 3/2014 | Casparian |
| 8,749,507 B2 | 6/2014 | DaCosta |
| 8,773,356 B2 | 7/2014 | Martin |
| 8,797,295 B2 | 8/2014 | Bernstein |
| 8,842,091 B2 | 9/2014 | Simmons |
| 9,146,596 B2 * | 9/2015 | Loo .................. G06F 1/203 |
| 9,178,509 B2 | 11/2015 | Bernstein |
| 9,274,660 B2 | 3/2016 | Bernstein |
| 9,280,248 B2 | 3/2016 | Bernstein |
| 9,318,006 B2 | 4/2016 | Heubel |
| 9,336,969 B2 | 5/2016 | Takashima |
| 9,400,582 B2 | 7/2016 | Bernstein |
| 9,477,342 B2 | 10/2016 | Daverman |
| 9,535,557 B2 | 1/2017 | Bernstein |
| 9,829,982 B2 | 11/2017 | Bernstein |
| 10,089,840 B2 | 10/2018 | Moussette |
| 10,120,450 B2 | 11/2018 | Bernstein |
| 10,860,112 B1 | 12/2020 | Knoppert |
| 2006/0109255 A1 | 5/2006 | Chen |
| 2007/0063987 A1 | 3/2007 | Sato |
| 2007/0241940 A1 * | 10/2007 | Hsu .................. G06F 1/1656 341/22 |
| 2007/0273671 A1 | 11/2007 | Zadesky |
| 2008/0098456 A1 | 4/2008 | Alward |
| 2008/0202824 A1 | 8/2008 | Philipp |
| 2008/0259046 A1 | 10/2008 | Carsanaro |
| 2009/0002178 A1 | 1/2009 | Guday |
| 2009/0243817 A1 | 10/2009 | Son |
| 2009/0315854 A1 | 12/2009 | Matsuo |
| 2010/0089735 A1 | 4/2010 | Takeda |
| 2010/0102830 A1 | 4/2010 | Curtis |
| 2010/0110018 A1 | 5/2010 | Faubert |
| 2010/0128002 A1 | 5/2010 | Stacy |
| 2011/0193787 A1 * | 8/2011 | Morishige ............... G06F 3/016 345/173 |
| 2012/0062491 A1 | 3/2012 | Coni |
| 2012/0092263 A1 * | 4/2012 | Peterson ............... G06F 3/0443 345/168 |
| 2013/0249802 A1 | 9/2013 | Yasutake |
| 2014/0340208 A1 * | 11/2014 | Tan .................. H01H 13/83 340/407.2 |
| 2015/0185842 A1 | 7/2015 | Picciotto |
| 2017/0269688 A1 | 9/2017 | Chan |
| 2018/0074694 A1 | 3/2018 | Lehmann |
| 2019/0073036 A1 | 3/2019 | Bernstein |
| 2020/0201405 A1 * | 6/2020 | Yoo .................. G06F 1/1675 |

FOREIGN PATENT DOCUMENTS

| | | |
|---|---|---|
| KR | 20040081697 A | 9/2004 |
| WO | 2004/042685 A2 | 5/2004 |
| WO | 2004/042693 A1 | 5/2004 |
| WO | 2005/057546 A1 | 6/2005 |
| WO | 2011/056752 A1 | 5/2011 |
| WO | 2011/071837 A2 | 6/2011 |

OTHER PUBLICATIONS

Rekimoto, J. et al., "PreSense: Interaction Techniques for Finger Sensing Input Devices," UIST '03 Vancouver, BC, Canada, Nov. 2003, pp. 203-212, ACM 1-58113-636-06/03/0010.

Holleis, P. et al., "Studying Applications for Touch-Enabled Mobile Phone Keypads," Proceedings of the Second International Conference on Tangible and Embedded Interaction (TEI'08), Feb. 18-20, 2008, Bonn, Germany, pp. 15-18.

Westerman, W. et al., "Multi-Touch: A New Tactile 2-D Gesture Interface for Human-Computer Interaction," Proceedings of the Human Factors and Ergonomics Society 45th Annual Meeting, Oct. 2001, pp. 632-636.

* cited by examiner

SYSTEM AND METHOD FOR VAPOR CHAMBER DIRECTIONAL HEAT DISSIPATION FOR A PIEZOELECTRIC KEYBOARD ASSEMBLY

FIELD OF THE DISCLOSURE

The present disclosure generally relates to a keyboard assembly of information handling systems. The present disclosure more specifically relates to directional dissipation of heat from internal components of a mobile information handling system, away from a keyboard assembly.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard for manual input of information by the user.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
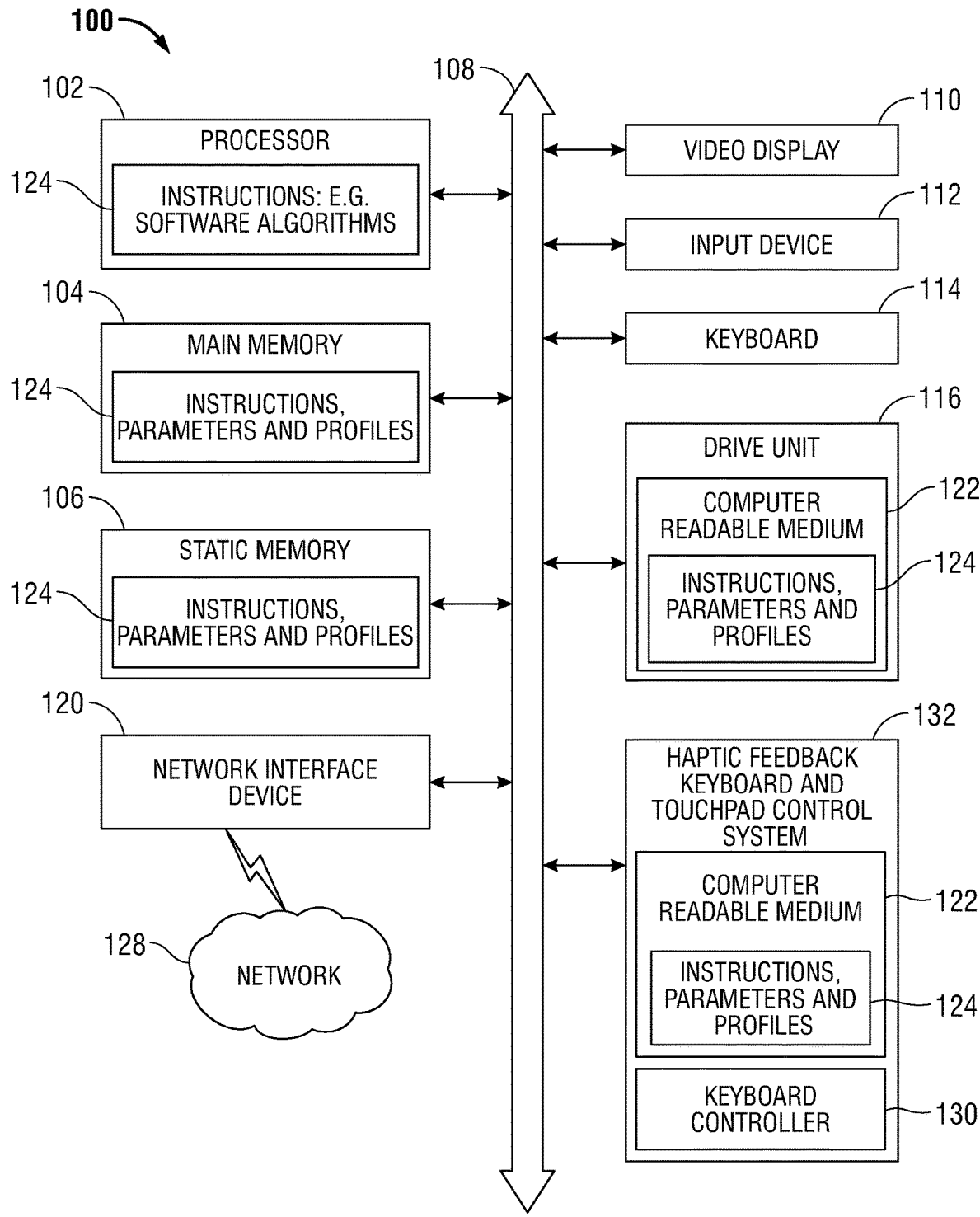
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

User demand drives the market for mobile information handling systems toward ever-slimmer, more lightweight laptop devices, prompting a need for ever-thinner keyboards and laptop bases. A solid-state piezoelectric keyboard provides a thinner, more light-weight improvement over traditional scissor mechanism keyboards. The use of piezoelectric elements within the keyboard may eliminate the use of other devices such as a scissor mechanism that are used to maintain a keycap of a key above an electrical connection or for a dive board type mechanism under a touchpad. Instead, such piezoelectric elements may reduce or eliminate those mechanical elements that may fail after a number of actuations while also reducing the thickness of the keyboard or the touchpad itself. Instead of the keys of the keyboard requiring travel of a scissor mechanism within a C-cover of the information handling system, the relatively thinner keys defined (either physically or visibly) on the solid-state keyboard of the presently-described information handling system may reduce the physical thickness of the keyboard within the information handling system. Further, the solid-state touchpad may eliminate the dive board mechanism and underlying click switch for selection of items via the mechanically actuated touchpad. This may enable a thinner, more streamlined information handling system.

Embodiments of the present disclosure provide for a keyboard of an information handling system. The keyboard may include, in an embodiment, a coversheet to identify an actuation location of an input actuation device. In an embodiment, a support layer may be placed underneath the coversheet to support the coversheet and other layers within the keyboard. The keyboard may, in an embodiment, include a contact foil placed between the coversheet and support layer. In the embodiments presented herein, the keyboard may include a piezoelectric element placed between the contact foil and support layer to receive an applied mechanical stress at the actuation location of the input actuation device. The keyboard of the information handling system, in an embodiment, may include a controller of the information handling system operatively coupled to the contact foil to receive an electric charge in the form of a piezo actuation signal from the piezoelectric element placed under the mechanical stress. The controller may also send haptic feedback control signal to the piezoelectric element of a signal varying in polarity, voltage or current to cause the piezoelectric element to provide haptic feedback at the actuation location.

During operation of the solid-state keyboard or touchpad of the information handling system described in embodiments herein, a key on the keyboard or the touchpad may be actuated by a user pressing down on a specific location. In an embodiment, this specific location may be visually indicated by an alphanumeric symbol such as those found on a QWERTY keyboard, a key pedestal or raised location, or another designation such as a tactile frame or depression in a cover sheet. The actuations of these specific locations by, for example, a user's finger causes a mechanical stress to be applied to the piezoelectric element resulting in the deformation of the piezoelectric element. Upon application of this mechanical stress and the deformation of the piezoelectric element, the piezoelectric element accumulates an electric charge that is passed to a controller of the information handling system via the contact foil described herein in the form of a piezo actuation signal. In an embodiment, the controller receives the piezo actuation signal and sends an electrical haptic feedback control signal back to the piezoelectric element. Upon application of the electrical haptic feedback control signal on the piezoelectric element by the controller, the piezoelectric element may be mechanically stretched or compressed so as to create a haptic feedback event such as the piezoelectric element warping up or down and returning to its pre-deformed state. This warping of the layers of the piezoelectric element causes the user to feel a haptic sensation at the actuated key or the specific location where the user pressed in order to actuate a key or touchpad. This haptic feedback against the user's finger may cause a sensation mimicking pressing a mechanical key thereby creating a feeling to a user that the key was pressed or that a touchpad has been clicked to select an item such as one displayed on a display screen in some embodiments.

In order to further decrease the thickness and weight of the keyboard and laptop base, one or more layers of the keyboard in embodiments of the present disclosure may provide a dual purpose as part of the piezoelectric haptic keyboard system described above. For example, a vapor chamber may provide a dual function as a directional heat dissipating element and as a support plate for the haptic keyboard assembly. The decrease in thickness resulting from use of a piezoelectric haptic keyboard system may place the top surface of a laptop base (e.g., C-cover), upon which a user rests her palms while typing, closer to heat producing components housed in the laptop base chassis. A system is needed to dissipate heat away from such heat producing components without increasing the vertical distance between these components and the palm rest in the C-cover (e.g., without increasing the thickness of the base chassis). Embodiments of the present disclosure may address this issue by dissipating heat via a vapor chamber acting as the bottom support plate for the haptic keyboard assembly toward one or more cooling mechanisms (e.g., fans or fins) placed along an exterior vertical edge of the base chassis, and away from the palm rest in the C-cover.

Other mechanisms may be employed either alone or in conjunction with such a directional heat dissipating structure in embodiments described herein. For example, one or more layers of the piezo haptic keyboard stack themselves may further dissipate heat in a horizontal plane to inhibit heat transfer vertically upward from heat generating internal components toward the top surface of the laptop base. As described herein, the piezo haptic keyboard stack may include several layers (e.g., keyboard cover sheet, deformable piezo electric layer, support plate, etc.), including one or more layers of adhesive binding these several layers together. A heat dissipating adhesive may provide the dual purposes in some embodiments of affixing multiple layers of the haptic keyboard assembly together and dissipating heat horizontally, toward the edges of the laptop base chassis, and away from the C-cover, without substantially increasing the thickness of the piezo haptic keyboard stack.

In another aspect of embodiments described herein, a layer of phase change material (e.g., organic paraffin blends, hydrated salts, etc.) may be disposed within the piezo haptic keyboard stack, between the heat generating components and the C-cover. Such a phase change material may absorb heat propagated toward the C-cover by moving from a solid to liquid state, thus mitigating any heat transfer toward portions of the C-cover into which a user may commonly come in contact. In still another example embodiment that employs a keyboard with individual keycaps disposed through openings or vias formed within the C-cover (rather than a continuous coversheet layer), a heat dissipating hydrophobic material may be injected into the keyboard assembly, between each of the keys of a hydrophobic layer maybe formed on the coversheet and under a lattice structure of vias for the keys. By using a heat dissipating hydrophobic material, heat may be similarly dissipated toward the edges of the laptop base chassis, rather than toward the C-cover. Any one or more of these mechanisms may be employed in embodiments of the present disclosure to dissipate heat from heat generating components in a horizontal plane, away from the C-cover. In such a way, embodiments of the present disclosure may mitigate closer placement between heat generating components of a mobile information handling system and the thinner mechanical or piezo haptic keyboards toward which the market is currently moving.

The overall thickness of the information handling system may be reduced so as to decrease the size and weight of the information handling system. In other embodiments, because the keyboard described herein has a reduced thickness, the space within the information handling system used to house other components, such as a battery, of the information handling system may be increased allowing for the increase in size of these components or the inclusion of additional components within the chassis of the information handling system. Additionally, because the solid-state keyboard described herein does not include the mechanical components (i.e., scissor mechanism and coupled key cap or dive board mechanism) as other keyboards or touchpads, the keyboard may be less susceptible to wear or mechanical strain over time. Instead, with the implementation of the piezoelectric elements and dual-purpose of one or more layers, the solid-state keyboard and backlight systems of embodiments herein use fewer mechanical parts and may be more robust, resulting in longer usable life.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a pager, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system may include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 may include one or more storage devices, one or more communications ports for communicating with external devices, as well as, various input and output (I/O) devices 112, such as a keyboard 114, a touchpad, a mouse, a video/graphic display 110, or any combination thereof. The information handling system 100 may also include one or more buses operable to transmit communications between the various hardware components. Portions of an information handling system 100 may themselves be considered information handling systems 100.

Information handling system 100 may include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 may include memory such as main memory 104, static memory 106, or other memory of computer readable medium 122 storing instructions 124 of the haptic feedback keyboard and touchpad control system 132, and drive unit 116 (volatile (e.g. random-access memory, etc.), nonvolatile memory (read-only memory, flash memory etc.) or any combination thereof. The information handling system 100 may also include one or more buses 108 operable to transmit communications between the various hardware components such as any combination of various input and output (I/O) devices.

The information handling system 100 may further include a video display 110. The video display 110 in an embodiment may function as a liquid crystal display (LCD), an organic light emitting diode (OLED), a flat panel display, or a solid-state display. Additionally, the information handling system 100 may include an input device 112, such as a cursor control device (e.g., mouse, touchpad, or gesture or touch screen input), and a keyboard 114. Various drivers and control electronics may be operatively coupled to operate input devices 112 such as the haptic keyboard 110 and haptic touchpad according to the embodiments described herein.

The network interface device shown as wireless adapter 120 may provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both licensed and unlicensed spectrums.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 128 may communicate voice, video or data over the network 128. Further, the instructions 124 may be transmitted or received over the network 128 via the network interface device or wireless adapter 120.

The information handling system 100 may include a set of instructions 124 that may be executed to cause the computer system to perform any one or more of the methods or computer-based functions disclosed herein. For example, instructions 124 may execute a haptic feedback keyboard and touchpad control system 132, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 116 and the haptic feedback keyboard and touchpad control system 132 may include a computer-readable medium 122 in which one or more sets of instructions 124 such as software may be embedded. Similarly, main memory 104 and static memory 106 may also contain a computer-readable medium for storage of one or more sets of instructions, parameters, or profiles 124 including haptic feedback modulation instructions that allow for a user to input a desired level of haptic feedback at a key or location on a touchpad. The disk drive unit 116 and static memory 106 may also contain space for data storage. Further, the instructions 124 may embody one or more of the methods or logic as described herein. For example, instructions relating to the haptic feedback keyboard and touchpad control system 132 software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100.

Main memory 104 may contain computer-readable medium, such as RAM in an example embodiment. An example of main memory 104 includes random access memory (RAM) such as static RANI (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The haptic feedback keyboard and touchpad control system 132 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include the haptic feedback keyboard and touchpad control system 132 that may be operably connected to the bus 108 and may also be connected to the metallic traces and piezoelectric elements of a haptic keyboard 114. The haptic feedback keyboard and touchpad control system 132 computer readable medium 122 may also contain space for data storage. The haptic feedback keyboard and touchpad control system 132 may, according to the present description, perform tasks related to receiving a piezo actuation signal in the form of an electric charge from a piezoelectric element and return an haptic feedback control signal to that piezoelectric element causing a haptic feedback at a key of the keyboard 114 associated with that piezoelectric element. In these embodiments, the haptic feedback keyboard and touchpad control system 132 may receive a piezo actuation signal from any of a plurality of piezoelectric elements each associated with a key on keyboard 114 (i.e., a QWERTY keyboard), a key pad, or a location on a touchpad. Input may be received by the haptic feedback keyboard and touchpad control system 132 either simultaneously or concurrently so as to provide a haptic feedback control signal to the corresponding piezoelectric elements as described herein.

In an embodiment of the present description, each of the keys of keyboard 114 may be associated with a piezoelectric element. The piezoelectric element may be used to, as described herein, create a piezo actuation signal in the form of an electrical charge relative to a key on the keyboard 114 and send that electrical charge to a controller. In an embodiment, the controller may receive the piezo actuation signal indicating actuation and send a haptic feedback control signal to the piezoelectric element. The controller of the haptic keyboard 114 may operate some or all of the haptic feedback keyboard and touchpad control system 132. Upon application of the haptic feedback control signal at the piezoelectric element (i.e., having specific current and voltage magnitude and polarity variations) associated with the actuated key of keyboard 114 causes the piezoelectric element to convert that haptic feedback control signal into a mechanical movement by, for example, warping the piezoelectric element upward or downward. The mechanical upward or downward movement or movements of the piezoelectric element due to the application of the haptic feedback control signal to the piezoelectric element may be felt by a user who actuated the key of keyboard 114. The haptic feedback control signal may comprise a sine wave, square wave, pulsed signal, burst signal, or customized changes in magnitude and polarity of varying levels of sharpness of changes, frequencies, duration or the like in a variety of embodiments. In an example embodiment, a deflection downward upon receiving a piezo actuation signal at the piezoelectric element followed by a rebound upward and return to a resting state or level may be used to mimic actuation of a mechanical key in some example embodiments.

In an embodiment, the keyboard controller 130 may execute instructions, parameter, and profiles 124 to enact the functions of the keyboard 114 as described herein. The haptic feedback keyboard and touchpad control system 132 in an embodiment may include one or more sets of instructions that, when executed by a keyboard controller 130, processor 102 or some combination of both, and causes a haptic feedback control signal to be applied to a piezoelectric element upon detection of a piezo actuation signal from the piezoelectric element. The one or more sets of instructions of the haptic feedback keyboard and touchpad control system 132 may also include one or more sets of instructions that, when executed by the keyboard controller 130, determines which of any plurality of keys of keyboard 114 were activated. In an example, the keyboard controller 130, the processor 102, or both may receive, from a piezoelectric element, a piezo actuation signal and produce a haptic feedback control signal to the piezoelectric element.

In an embodiment, the haptic feedback keyboard and touchpad control system 132 may also include one or more sets of instructions that, when executed by a processor, adjusts the polarity, voltage, or current of electrical haptic response control signal applied to any piezoelectric element. This adjustment may be completed based on the desired haptic responses from the piezoelectric elements, the lifespan of the piezoelectric element, the electrical characteristics of the piezoelectric element, the mechanical characteristics of the piezoelectric element, or combinations thereof. Because these characteristics may be different from one piezoelectric element to the other, the electrical haptic response control signal applied any given piezoelectric element by the keyboard controller 130 may be customized to produce a specific level of haptic feedback at any given key of keyboard 114. In an embodiment, the keyboard controller 130 of the information handling system 100 may include a look-up table. In this embodiment, the keyboard controller 130 of the information handling system 100 may access the look-up table in order to determine how an electrical haptic response control signal is to be applied to any given piezoelectric element and at what polarity or voltage of the electrical haptic response control signal to the piezoelectric elements.

The one or more sets of instructions of the haptic feedback keyboard and touchpad control system 132 may also include one or more sets of instructions that, when executed by the keyboard controller 130, causes any number of subsequent current pulses to be applied to any piezoelectric element. In this embodiment, the subsequent electrical pulses may cause a haptic feedback event to a user who actuated a key of keyboard 114 or changes in magnitude, polarity, frequency, or pulses of haptic feedback to emulate the feel of a mechanical keystroke including adjustment of the feel of depth of the haptic-emulated keystroke or some other haptic feedback event. In other embodiments, the haptic feedback of the keyboard 114 may not need to emulate a keystroke of a mechanically actuated keyboard but instead provide a distinct haptic feel to indicate that a keystroke has occurred on the solid-state keyboard 114 to the user.

In an embodiment, the application of any current and voltage applied to any of the piezoelectric elements associated with any of the keys of keyboard 114 may be dependent on an application being executed by the processor 102. By way of example, a user may be engaged in providing input, via the keys of the keyboard 114, to a processor 102 in order to cause output to be provided. In a specific embodiment, the information handling system 100 may execute a basic input/output system (BIOS). Upon execution of the BIOS, the haptic feedback keyboard and touchpad control system 132 may begin to detect electrical signals or charges emitted from a piezoelectric element being placed in a strain by the actuation of a corresponding key on the keyboard 114. This may allow the haptic feedback keyboard and touchpad control system 132 to receive input at times when the information handling system 100 is in an on state. In an alternative embodiment, the execution of other application programs by a processor 102 of the information handling system 100, such as word processing application program may trigger the haptic feedback keyboard and touchpad control system 132 to begin to detect the electrical charges produced at any given piezoelectric element. By deferring input received from the piezoelectric element at the keyboard controller 130 or any other controller or processor, accidental input may be prevented by any errant touch of the keyboard 214.

In an embodiment, the haptic feedback keyboard and touchpad control system 132 may communicate with the main memory 104, the processor 102, the video display 110, the alpha-numeric input device 112, and the network interface device 120 via bus 108, and several forms of communication may be used, including ACPI, SMBus, a 24 MHZ BFSK-coded transmission channel, or shared memory. Keyboard driver software, firmware, controllers and the like may communicate with applications on the information handling system 100.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

Figure 2:
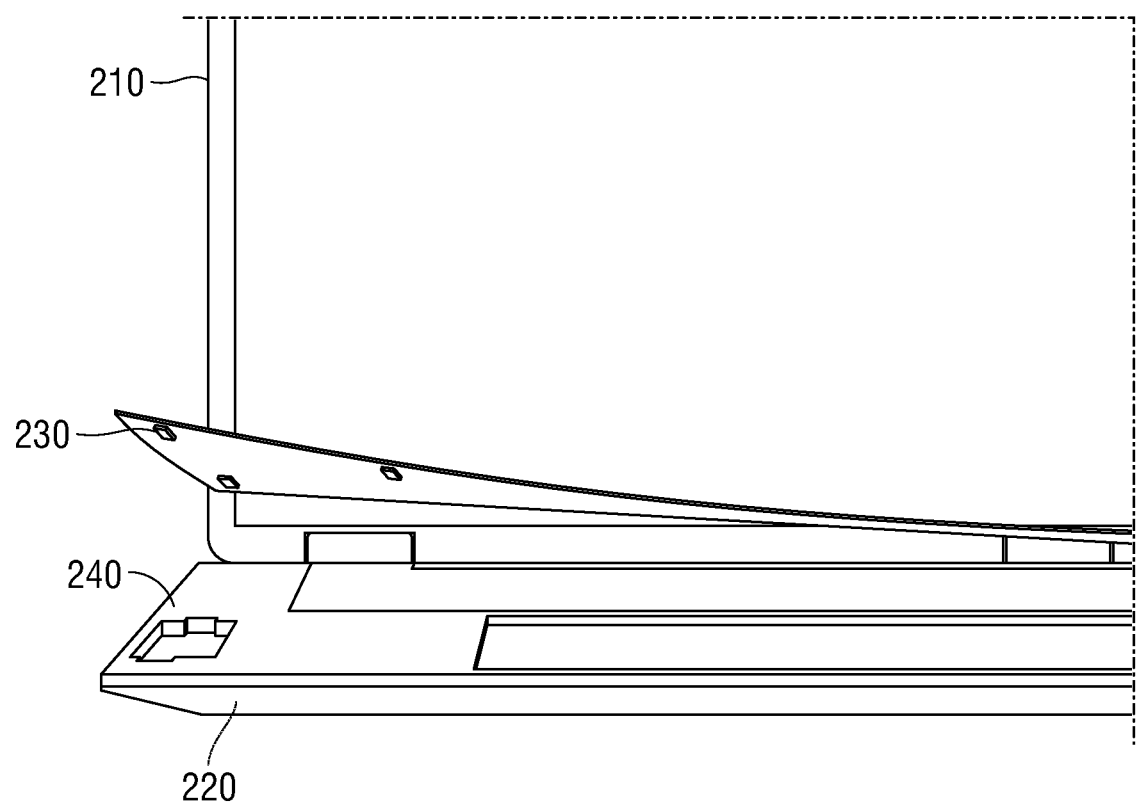
FIG. 2 is a graphical view of a haptic keyboard cover sheet and information handling system according to an embodiment of the present disclosure.

FIG. 2 is a graphical view of a haptic keyboard cover sheet with keys placed atop a base chassis top cover of a mobile information handling system according to an embodiment of the present disclosure. A haptic keyboard assembly in an embodiment may be integrated with a mobile information handling system, such as a laptop, for example, that includes a display chassis 210 and a base chassis 220. The display chassis 210 may house a video display, and the base chassis 220 may house a keyboard, a touchpad, as well as various internal components of the information handling system (e.g., central processing unit (CPU), graphics processing unit (GPU), fans, etc.).

The base chassis 220 in an embodiment may include a base chassis C-cover 240, including palm rests, keys, or touchpad with which a user's hands may routinely come into contact. Design specifications may thus require temperature of the base chassis C-cover 240 to remain below certain threshold values for safety reasons. The haptic keyboard of embodiments herein in C-cover 240 may resemble a conventional keyboard assembly where one or more holes or vias may be formed in a lattice of the base chassis C-cover 240, and through which individual key cap pedestals or key assemblies may be inserted or partially inserted. In embodiments, key cap pedestals or other key designations in a haptic keyboard assembly may be formed as a single, continuous haptic keyboard cover sheet 230 placed atop the base chassis C-cover 240. The continuous haptic keyboard cover sheet 230 may be bonded or otherwise affixed to the top surface of the base chassis C-cover 240 in an embodiment. For example, the continuous haptic keyboard cover sheet 230 may be affixed to the base chassis C-cover 240 via an adhesive, clamps, screws, magnets, or other known mechanisms. Portions of the haptic keyboard stack (e.g., deformable piezo element layer) may be disposed within the base chassis 220 in an embodiment.

Figure 3A:
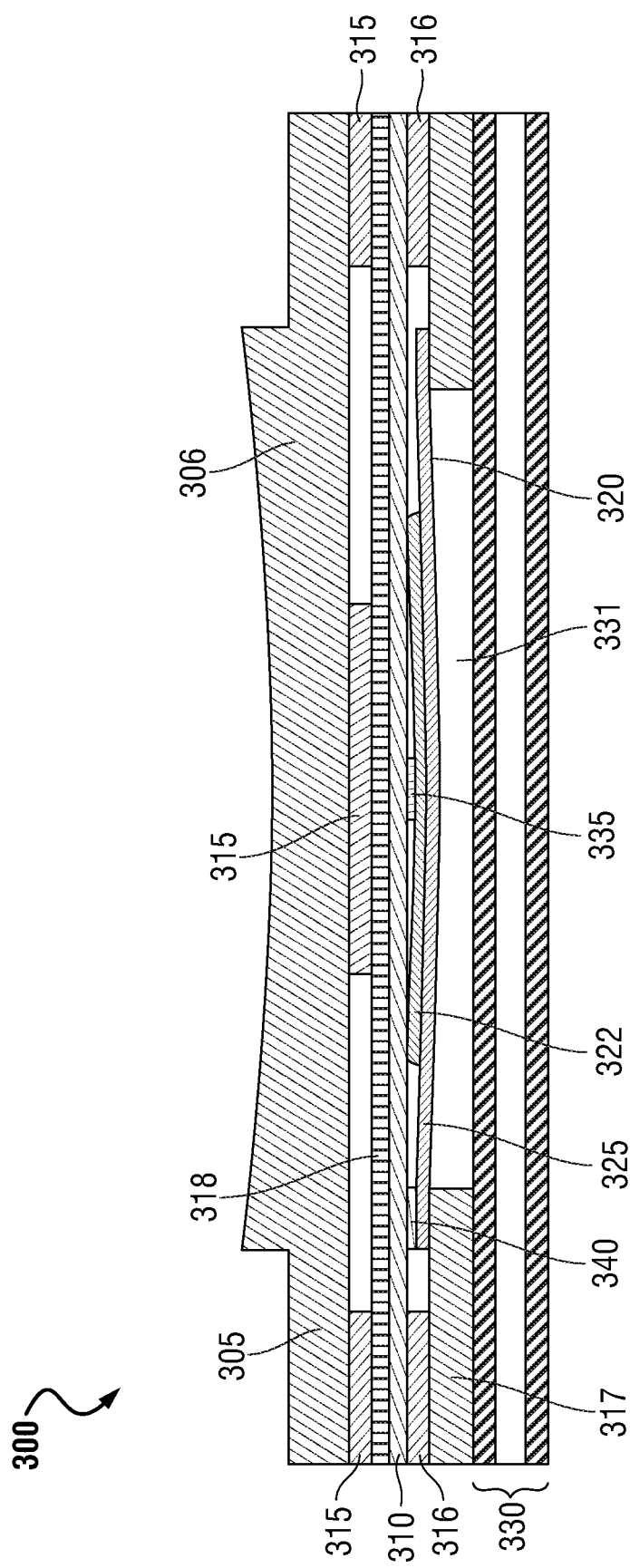
FIG. 3A is a side cut-out view of a key 300 of a keyboard implementing a dual-purpose vapor chamber in a haptic keyboard assembly according to an embodiment of the present disclosure.
Figure 3B:
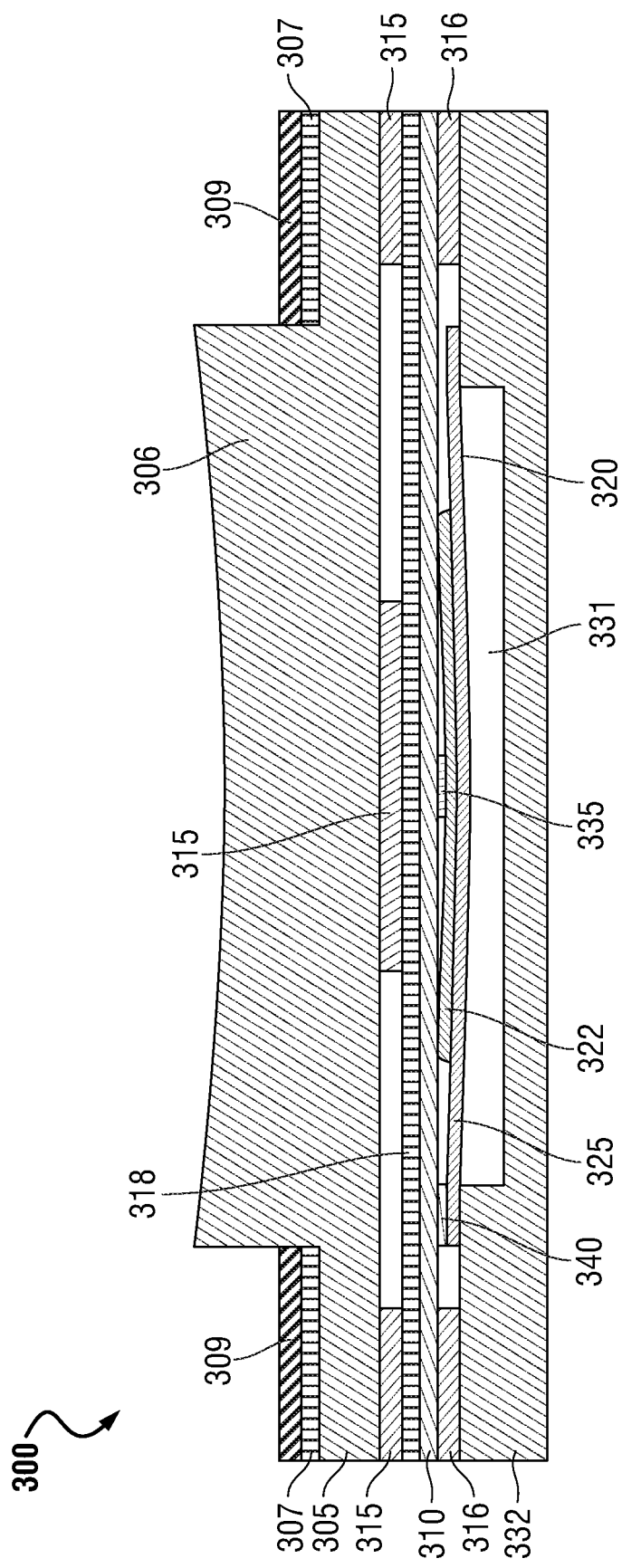
FIG. 3B is a side cut-out view of a key 300 of a keyboard implementing a hydrophobic material and phase change material in a haptic keyboard assembly according to an embodiment of the present disclosure.
Figure 3C:
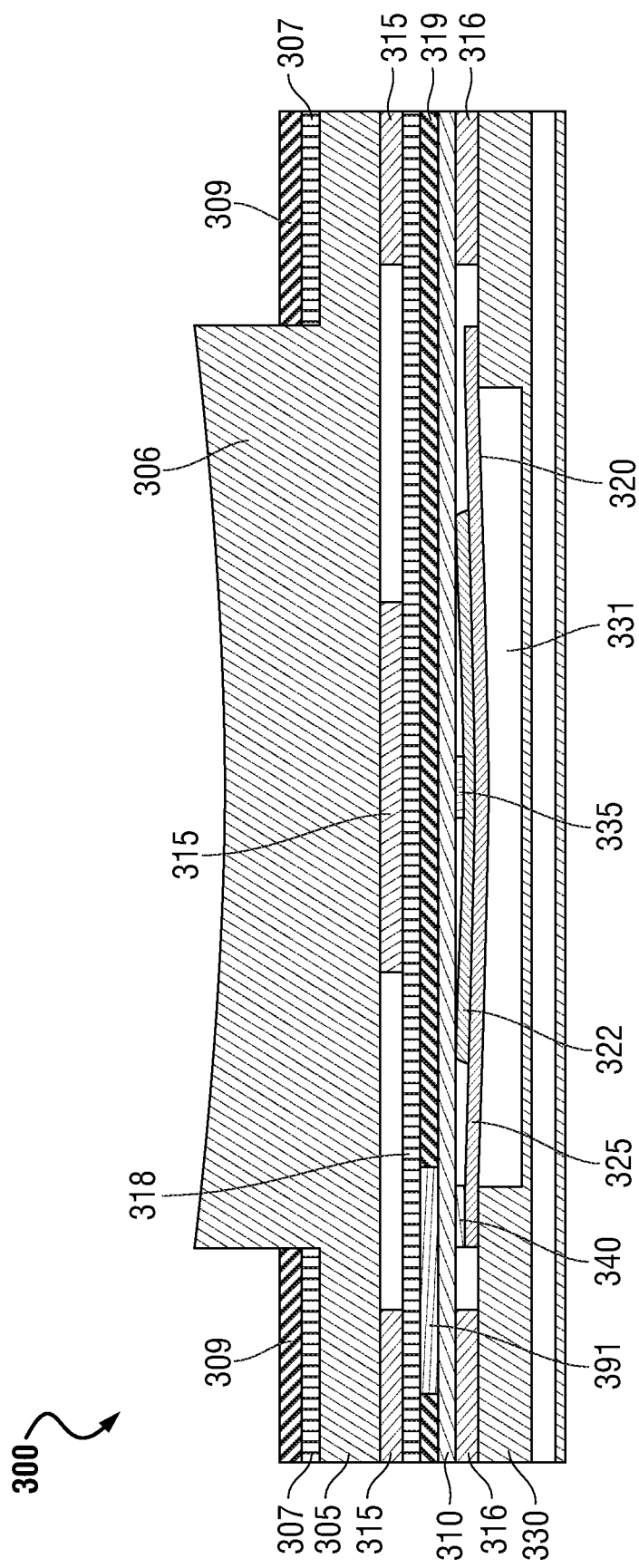
FIG. 3C is a side cut-out view of a key 300 of a keyboard implementing a vapor chamber in a haptic keyboard assembly according to an embodiment of the present disclosure.

FIGS. 3A, 3B, and 3C are side cut-out views of a key 300 of a keyboard implementing various directional heat-dissipating mechanisms according to an embodiment of the present disclosure. FIG. 3A depicts a dual use vapor chamber layer acting as a support plate for a haptic keyboard assembly in an embodiment. FIG. 3B depicts a heat dissipating hydrophobic material and phase change material in a haptic keyboard assembly having individual key caps inserted through vias in a C-cover in another embodiment. FIG. 3C depicts a heat dissipating vapor chamber, hydrophobic material, and phase change material in a haptic keyboard assembly having individual key caps inserted through vias in a C-cover in yet another embodiment. FIG. 3A, FIG. 3B, and FIG. 3C share several similar layers otherwise as described herein. In the embodiments of the present disclosure, one or more layers of the keyboard in embodiments of the present disclosure may provide a dual purpose as part of the piezoelectric system described above, and as part of a directional heat-dissipating mechanism. Such dual-purposing of one or more layers may decrease the thickness and weight of the combined piezoelectric keyboard and heat dissipation systems in an embodiment.

According to an embodiment, the key 300 may be formed of a plurality of layers, one layer of which is a piezoelectric element 320. Although FIGS. 3A, 3B, and 3C show a cross-sectional view of a single key 300, the present specification contemplates that a keyboard may also include a plurality of these similar keys 300 arranged as, for example, a QWERTY-type keyboard. Consequently, FIGS. 3A, 3B, and 3C are not intended to be limiting but merely intended as a description of operation of any type of input device contemplated by the present disclosure.

As shown in FIGS. 3A, 3B, and 3C, the key 300 includes a coversheet 305. The coversheet 305 may be made of any type of elastically resilient material. The elastically resilient material may allow, at least, a portion of the key 300 to be deformed upon application of a pressure from a user's finger. Upon withdrawal of the pressure from the user's finger, the material the coversheet 305 is made of allows the coversheet 305 of the key 300 to bend back to its pre-deformed state. In an embodiment, the resilient material may allow the coversheet 305 to travel a minimal distance and still deform a piezoelectric element 320. For example, a distance of between 0.01 mm and 2 mm. In an embodiment, the distance is between 0.05 mm and 0.15 mm. In an embodiment, the distance is 0.1 mm.

In an embodiment, the shape of the coversheet 305 may have a selection of key pedestals 306 of various sizes and shaped so as to conform to a user's finger. In an embodiment, in order to shape the coversheet 305, the material used to form the coversheet 305 may be subjected to an injection molding process. As such, a top portion of the coversheet 305 may be formed to be ergonomically beneficial to a user's actuation such as by conforming to the user's fingers and including a pedestal 306 to highlight the key location, for example. In other embodiments, no key pedestals may be formed and a key location may be described in coversheet 305 via markings, depressions, key framing, or other methods. The injection molding process may be completed prior to the installation of the coversheet 305 into the remaining layers within the keyboard 300 as described herein. Any number of processes may be included with the injection molding process. In an embodiment illustrated by FIG. 3A, the injection molding process used to form the coversheet 305 may include forming a number of holes within a translucent sheet of acrylonitrile butadiene styrene (ABS). These holes may correlate with a number of keys on a keyboard. The formation of the coversheet 305 in such an embodiment may continue with injection molding a translucent ABS through the holes to form a raised portion correlating with each of the number of keys on the keyboard. Opposite the raised portions a number of runners may be machined away to accommodate for receipt of other layers of the keyboard such as each of the piezoelectric elements. The surface of the coversheet on which the raised portions are formed may be painted and any number or type of graphics may be laser etched on each raised portion indicating a specific key of the keyboard.

In other embodiments, the coversheet 305 may be formed over each key 300 an disposed through a plurality of vias within a C-cover 309 of the base chassis for keys 300 having a cover sheet 305 or key cap pedestal 306 for each key, as illustrated in FIGS. 3B and 3C. For example, a key pedestal 306 for each key 300 in a solid-state haptic keyboard of the present embodiments may be disposed through the vias in the C-cover 309 in such embodiments illustrated in FIG. 3B and FIG. 3C. Each haptic key of the haptic keyboard in such embodiments may include a cover layer 305 with portions (e.g., pedestal 306) similar to those described directly above with respect to FIG. 3A that protrudes through the key vias in the C-cover 309. A hydrophobic material 307 layer may be disposed or injected between the C-cover 309 and the cover layer 305. Such a hydrophobic material 307 in an embodiment may provide the dual purposes of dissipating heat and repelling liquids that could harm the components of the keyboard assembly. In an example embodiment, the hydrophobic material 307 may be a perfluoroalkyl.

Though gaps between haptic keys and key vias may be minimized in the embodiments described with reference to FIGS. 3B, and 3C, such gaps may be useful for cooling ventilation of the base chassis or for allowing backlighting to frame the haptic keys. Similarly, a touchpad top touch interface layer may be attached under the coversheet 305 to seamlessly provide a designated touchpad area in the coversheet 305. Any combination of continuous coversheet for haptic keys and vias in the coversheet for placement of haptic keys of a keyboard coversheet layer are contemplated in various embodiments. Further, it is contemplated that in some embodiments one or the other of a haptic keyboard or haptic touchpad may be used with a keyboard having mechanically actuated or a touchpad with a mechanically actuated diving board mechanism.

Embodiments incorporating individual key pedestal caps 306 inserted through vias within the C-cover layer lattice 309 may also include additional cooling mechanisms. For example, in an embodiment described with reference to FIG. 3B, the phase change material 318 may be disposed atop a contact foil layer 310, which may be adhered to the top surface of a support plate 332. In other embodiments, the support plate 332 in an embodiment described with reference to FIG. 3B may be replaced by a vapor chamber, such as described with reference to FIG. 3A. As another example, in an embodiment described with reference to FIG. 3C, a light guide layer 319 including a light emitting diode (LED) 391 may be disposed between the contact foil 310 and a vapor chamber 330 acting as the rigid support member for the mechanical keyboard.

It is contemplated that features in any of FIGS. 3A, 3B, and 3C may be utilized and layered in any of the other embodiments shown in those figures. For example, a vapor chamber 330 may be used with the embodiment of FIG. 3B and it may be a separate vapor chamber 330 and spacer layer 317 of FIG. 3A or a vapor chamber 330 with cavities 331 formed in the top layer of the vapor chamber 330 of FIG. 3C. Similarly, the vapor chamber 330 with cavities 331 formed therein may be utilized with the embodiment of FIG. 3A and the vapor chamber 330 and spacer layer 317 may be used with the embodiment of FIG. 3C in other embodiment variations. In another example, the LED 391, such as a micro LED or other LED, or lightguide layer 319 may be utilized with either embodiment of FIG. 3A or FIG. 3B in embodiment variations. In an additional example, the phase change material layer 318 may or may not be utilized and implemented as shown in any of the embodiments of FIG. 3A, 3B, or 3C in embodiment variations. Further, the hydrophobic material layer 307 may be used or not used in embodiments of FIG. 3B and FIG. 3C in variation of embodiments herein.

The key 300 in FIGS. 3A, 3B, and 3C may further include a number of adhesive layers 315 that physically couple the various layers of the key 300 together. In an embodiment, a first adhesive layer 315 may be formed on the coversheet 305 to adhere the coversheet 305 to a phase change material layer 318. The first adhesive layer 315 may include the placement of the adhesive at locations that may enhance the movement and prevent the hindrance of the actuation of the coversheet 305. In a specific embodiment, the first adhesive layer 315 may include placing the adhesive along borders of the key 300 as well as placing the adhesive at a central location of the key 300. As described herein, one or more layers of the piezo haptic keyboard stack may operate to dissipate heat in a horizontal plane (e.g., along the surface of the first adhesive layer 315), rather than vertically (e.g., upward from the first adhesive layer 315 toward the coversheet 305). For example, the upper adhesive layer 315 or the lower adhesive layer 316 may be comprised of heat-dissipating adhesive materials. Such materials may include, for example, heat dissipating epoxies, silicones, or elastomeric materials. In some embodiments, an additional layer of phase change material may be disposed between the upper adhesive layer 315 and the contact foil layer 310. Such a phase change material may absorb heat propagated toward the coversheet 305 by moving from a solid to liquid state, thus mitigating any heat transfer toward the coversheet 305 into which a user may commonly come in contact. Examples of phase change materials in an embodiment may include polyolefin elastomers, organic wax, non-paraffin organic materials, or hydrated salts. In such a way, embodiments of the present disclosure may mitigate closer placement between heat generating components of a mobile information handling system and the thinner mechanical or piezo haptic keyboard assemblies toward which the market is currently moving.

The contact foil 310 in may be adhered to the coversheet 305 or may be affixed to a bottom surface of the phase change material 318 (as shown in FIGS. 3A and 3B), or to a bottom surface of a light guide layer 319 (as shown in FIG. 3C). The contact foil 310 illustrated in FIGS. 3A, 3B, and 3C may be made of any elastically resilient material that, when the coversheet 305 of key 300 is actuated or the contact foil 310 is bent towards a lower portion of the key 300, returns to its original state when the key 300 is no longer being actuated. The contact foil in an embodiment may be a flexible material, such as polyethylene terephthalate (PET) serving as a polyester printed circuit board or other type of flexible printed circuit board, in several example embodiments. The contact foil 310 may include a number of metal traces formed on one or more of its surfaces. The metal traces of the contact foil 310 in the embodiments illustrated in FIGS. 3A and 3B may electrically and communicatively couple each of the corresponding piezoelectric element 320 of key 300 to a keyboard controller such as a processor of an information handling system that includes a haptic feedback keyboard control system such as described herein. The metal traces of the contact foil 310 in the embodiment illustrated in FIG. 3C may electrically and communicatively couple the LED 391 to an LED controller. Formation of metal traces may be made according to a variety of methods including photolithographic techniques for applying metal or lamination of copper strips or other metal layers.

In an embodiment described with reference to FIG. 3A, portions of the contact foil 310 may be physically coupled to a spacer plate 317 disposed across the surface of a vapor chamber 330 acting as a support plate for the haptic keyboard via a second layer of adhesive 316. The location of the placement of the second adhesive layer 316 may include placing the adhesive along borders of the key 300. In another embodiment described with reference to FIG. 3C, the vapor chamber 330 may provide structural support for a haptic keyboard assembly as a dual purpose vapor chamber and support plate 330 with cavities 331 on one (top) surface under piezoelectric elements 320. The vapor chamber 330 in embodiments may be a hollow chamber formed of heat-propagating material (e.g., copper) housing a pressurized fluid (e.g., water). As portions within the information handling system increase in temperature, portions of the heat-propagating material forming the chamber situated just above or below those portions of the information handling system will also increase in temperature. Consequently, the pressurized fluid situated in these portions of the chamber may move from a liquid to vapor state, and moves to a cooler portion of the chamber, where it condenses back into liquid form, and transfers heat to surrounding structures (e.g., cooling fins or fans affixed to or placed adjacent the vapor chamber). As described herein, the vapor chamber 330 may also provide stability, support, or rigidity for the other layers of the haptic keyboard assembly in an embodiment.

In an embodiment presented herein with reference to FIGS. 3A, 3B, and 3C and, the piezoelectric element 320 may include a first portion 322 that may be any solid piezoelectric material that accumulates an electric charge when a mechanical stress is applied to it or specifically, in the embodiments presented herein, when the solid material is deformed. Solid materials used to form the piezoelectric element 320 may include crystals, ceramics, or protein layers, among other types of materials. For ease of explanation, the piezoelectric element 320 may be made of a type of ceramic although the present specification contemplates the use of other types of piezoelectric materials.

The piezoelectric element 320 may be housed over a cavity 331 in embodiments described with reference to FIGS. 3A, 3B, and 3C. For example, in an embodiment described with reference to FIG. 3A, the cavity 331 may be an aperture or hole through spacer plate 317 or may be a depression or hole in spacer plate 317 that does not pass through 317, as described in greater detail with respect to FIG. 4. As another example, in an embodiment described with reference to FIG. 3B, the cavity 331 may be a via formed in a support plate 330 for a piezo haptic keyboard assembly, in a spacer plate 317, or in cavities formed in a top surface of vapor chamber 330. As yet another example, in an embodiment described with reference to FIG. 3C, vapor chamber and support plate 330 may have cavities 331 formed in the top layer, the cavity 331 may be a via formed in a support plate 330 for a piezo haptic keyboard assembly, or the cavity 331 may be formed in a spacer plate 317 operatively coupled to the top surface of vapor chamber 330.

The piezoelectric element 320 illustrated in FIGS. 3A and 3B may comprise two portions 322 and 325 each electrically coupled via electric contact points such as soldering points 335 and 340, respectively, to a different electrical trace on the surface of the contact foil 310. The first portion 322 may be a ceramic disk in an embodiment. Second portion 325 of the piezoelectric element 320 may be a metal plate or ring, such as a brass plate, that extends beyond the edges of cavity 331. The first portion 322 and the second portion 325 may be operatively coupled via adhesive including conductive adhesives. The soldering points 335 and 340 may be silver solder contact points for operative electrical coupling to metal traces on the surface of contact foil 310. As so oriented, the first soldering point 335 and second soldering point 340 may be formed to receive an electrical charge (e.g., a piezo actuation signal) upon deflection of the piezoelectric element 320 as a user actuates the key 300. The brass plate 325 supports deflection of the piezoelectric element 320 into the cavity 331 to detect mechanical actuation of the key 300.

In an embodiment presented herein, the piezoelectric element 320 may be any solid material that accumulates an electric charge when a mechanical stress is applied to it or specifically, in the embodiments presented herein, the solid material is deformed. Solid materials used to form the piezoelectric disk 322 or other piezoelectric material as part of a first portion 322 of the piezoelectric element 320 may include crystals, ceramics, biological matter, protein layers, among other types of materials. For ease of explanation, the piezoelectric disk material 322 may be made of a type of ceramic although the present specification contemplates the use of these other types of materials.

During operation of the key 300 in embodiments described with reference to FIGS. 3A and 3B, the contact foil 310 may transmit the piezo actuation signal from the piezoelectric element 320 via the metal traces that conduct the electrical charge to the keyboard controller or other processor associated with the key 300. For example, as the piezoelectric disk material 322 is compressed by deflection and the metal plate or ring 325 warped downward toward the cavity 331 within spacer plate 317 or the support plate 330, a change in voltage may be detected. The piezo actuation signal (electrical charge) created when the user actuates the key 300 and the piezoelectric element 320 is subjected to a mechanical stress may be detected between soldering points 335 and 340. The piezo actuation signal (electrical charge) may be communicated down metal traces formed on the contact foil 310 to a controller (not shown).

The metal traces formed on the contact foil 310 in embodiments described with reference to FIGS. 3A, 3B, and 3C may further be used to conduct a return haptic feedback control signal from the controller to the piezoelectric element 320 so that the voltage and current of the haptic feedback control signal may cause the piezoelectric element 320 to return to a planar piezoelectric element 320 or otherwise move, as required to cause a specified haptic response (e.g., haptic movement feedback or haptic sound feedback) felt or heard by the user via coversheet 305. For example, this haptic feedback control signal may have a certain voltage, current, and polarity (−,+) sufficient to render the piezoelectric material of the piezoelectric element 320 to cause a haptic movement or sound. Such a haptic feedback control signal may be a sine wave, a square wave, a pulsed signal, or other waveform of changing current, voltage, or polarity applied to the piezoelectric element 320. This application of voltage in the haptic feedback control signal may cause an upward or downward warping of the piezoelectric element 320, and consequently, a haptic feedback (e.g., haptic movement feedback or haptic sound feedback) presented at the key 300 via the contact foil 310, adhesive 315, and coversheet 305 that the user may feel or hear. Upon receiving a piezo actuation signal, the controller in an embodiment may send the haptic feedback control signal back to the piezoelectric element 320 via the metal traces formed on the contact foil 310, through the soldering points 335 and 340 and to a conductive layer of metallic plate or ring 325 formed below the piezoelectric disk material 322.

Such a haptic feedback control signal, such as a sine wave signal, or other haptic feedback control signals with varying polarities, frequencies, or voltage (magnitude or amplitude) and current may be used by the keyboard controller to create the haptic feedback (e.g., haptic sound feedback or haptic movement feedback) felt or heard by the user as described herein. In these embodiments, the piezo actuation signal sent from the piezoelectric element 320 to the keyboard controller and the haptic feedback control signal sent from the controller to the piezoelectric element 320 may propagate along the two metal traces formed on a surface of the contact foil 310. The contact foil 310 may therefore, in an embodiment, include double the number of metal traces on at least one of its surface as that of the number of piezoelectric elements 320 used to form a keyboard that includes multiple keys 300. This haptic feedback may be relayed to the user within microseconds of the user actuating the key 300 such that the user physically detects a sensation or hears an audible sound indicating that the key 300 was pressed. This sensation felt or heard by the user may be present despite no actual mechanical devices such as a scissor mechanism or other types of keyboard mechanical devices being present among the layers of the key 300. The haptic feedback control signal to the piezoelectric element 320 may vary in magnitude and pulsing to create the desired haptic feedback (e.g., haptic sound feedback or haptic movement feedback) at key 300.

FIGS. 3A, 3B, and 3C show an image of a single key 300. The present specification contemplates that a plurality of keys 300 may be formed alongside each other in order to form, for example, a number pad, a keyboard, or a combination thereof. Consequently, although the features of the key 300 depicted in FIGS. 3A, 3B, and 3C apply to a single key 300, the present specification contemplates that any number of keys 300 may be formed on the keyboard so as to allow for the formation of an input device such as a keyboard. The keys 300 may be of any size (e.g., spacebar, tab key, or the like) and depending on size may include more than one piezoelectric element 320 associated with it. As the user actuates each of the keys 300, a haptic feedback (e.g., haptic sound feedback or haptic movement feedback) may be felt or heard by the user so as to present to the user a sensation that the key was pressed. This operation of key 300 may be conducted every time the user actuates the key 300. In some embodiments, the haptic sound feedback operation of key 300 may also be conducted separately from actuation of the key 300, as a user notification.

The formation of the key 300 may, in the embodiments presented herein, provide for a keyboard that has a relatively shorter distance of key travel as compared to piezoelectric haptic keyboards that comprise two separate contact foil layers, and as compared to those keyboards that implement mechanical devices such as a scissor mechanisms and key caps. In an embodiment, the distance of travel of the key 300 may be smaller than 0.1 mm. With the shorter distance of key travel, the overall thickness of the keyboard placed within an information handling system may be reduced. This increases the available footprint within a base chassis of, for example, a notebook-type information handling system that may be used for more or larger components (e.g., batteries) to be placed within the base chassis. Additionally, or alternatively, the reduction in thickness of the keyboard may reduce the overall thickness of the information handling system improving the aesthetics of the design of the information handling system. This reduction in size of the information handling system may also result in the reduction of the size or weight of the information handling system thereby increasing the portability of the information handling system by the user.

The keys 300 of the present embodiments also include no moving mechanical parts. With the absence of mechanical moving parts, the key 300 of the presently described embodiments may be relatively more robust thereby increasing the useful life of the key 300. This may increase user satisfaction over the useful lifetime of the information handling system.

Figure 4:
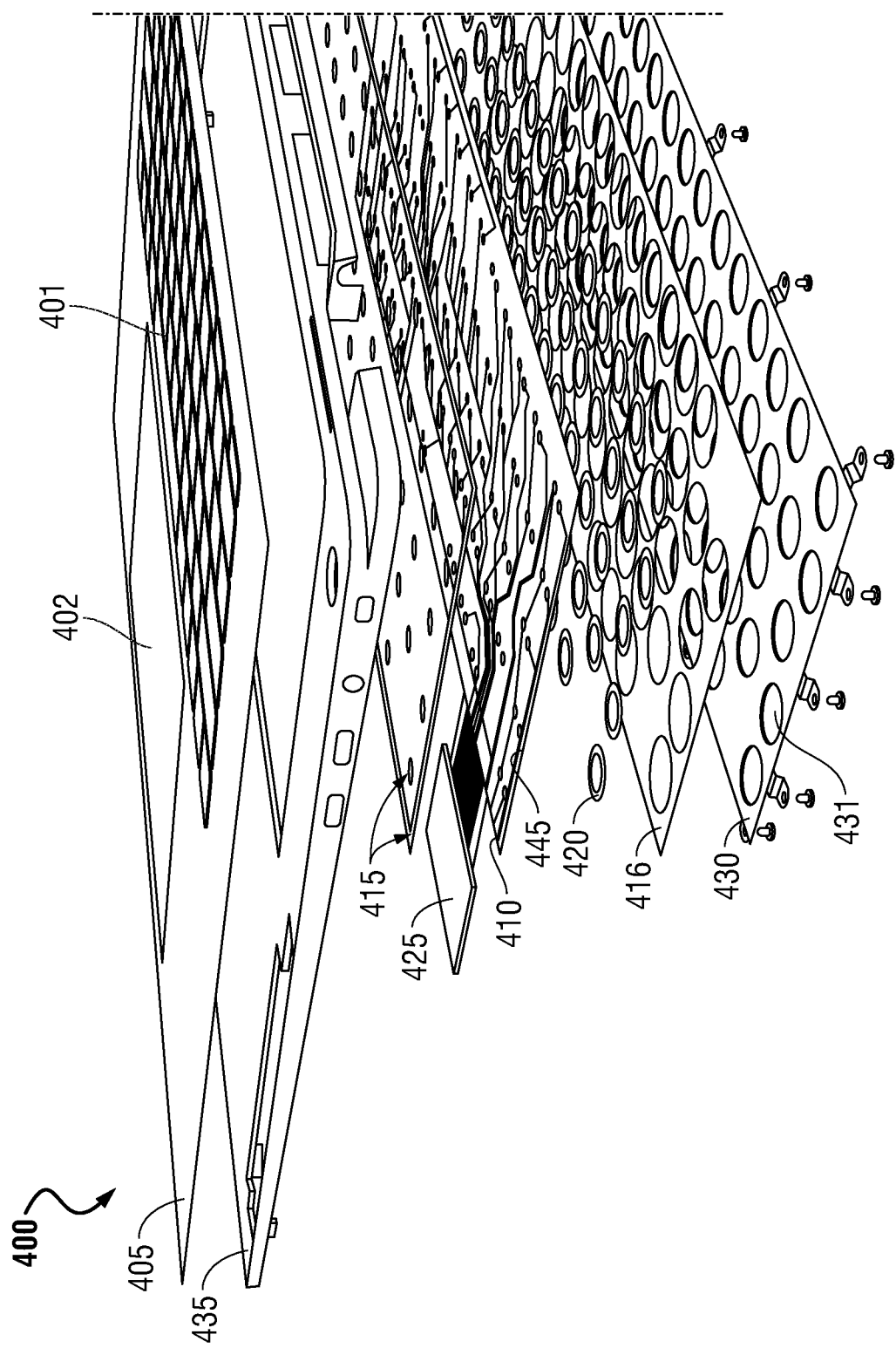
FIG. 4 is an exploded perspective graphical view of a piezo haptic keyboard layer stack according to an embodiment of the present disclosure.

FIG. 4 is an exploded perspective graphical view of a piezo haptic keyboard layer stack including heat dissipating adhesive layers and a vapor chamber support plate according to an embodiment of the present disclosure. The keyboard stack up 400 shows a plurality of keys, similar to those described in connection with embodiments of FIG. 3A, FIG. 3B, FIG. 3C or variations of those embodiments, arranged so as to receive input from a user at multiple keys. FIG. 4 also shows a top coversheet 405 having both a keyboard 401 and a touchpad 402. Either or both of the keyboard 401 and touchpad 402 may be haptic systems as described in embodiments herein. In an embodiment, the keys may be arranged similar to a QWERTY design of a keyboard 401. However, other arrangements of any alphabetic, numeric, or symbolic keys is contemplated by the present description.

The keyboard stack up 400 may include several layers similar to those described in connection with either FIG. 3A, FIG. 3B, or FIG. 3C. In an embodiment, the keyboard stack up 400 includes a coversheet layer 405. The coversheet layer 405 may be made of any type of elastically resilient material. In one embodiment, described with reference to FIG. 3A, the coversheet layer 405 may comprise a single continuous layer of material. Coversheet layer 405 in such an embodiment may include a plurality of key designations, such as key pedestals as shown in keyboard 401 and a touchpad 402 area designation. For a haptic touchpad 402, coversheet layer 405 may include a touchpad interface area designation. The elastically resilient material may allow, at least, a portion of the coversheet layer 405 to be deformed upon application of a pressure from a user's finger. Upon withdrawal of the pressure from the user's finger, the material the coversheet layer 405 is made of allows the coversheet layer 405 of the key to bend back to its pre-deformed form.

In such an embodiment, in order to shape the coversheet 405, the material used to form the coversheet 405 may be subjected to an injection molding process completed prior to the installation of the coversheet 405 into the remaining layers within the keyboard 401 or touchpad 402 as described herein. Any number of processes may be included with the injection molding process, including forming a number of holes correlated with a number of keys 401 on the keyboard 400 within a translucent sheet of ABS, and injection molding a translucent ABS through the holes to form a raised portion correlating with each of the number of keys 401 on the keyboard 400. Opposite the raised portions a number of runners may be machined away to accommodate for receipt of other layers of the keyboard such as each of the piezoelectric elements 420.

In other embodiments, such as those described with reference to FIGS. 3B and 3C, the coversheet of the C-cover 435 may include a plurality of vias for keys 401 having a cover sheet 405 or cap for each key 401. A key pedestal for each key 401 in a solid-state keyboard of the present embodiments may be disposed through the vias in the C-cover 435 in such embodiments. Each haptic key of the haptic keyboard in such an embodiment may include a cover layer with translucent portions similar to those described directly above that protrudes through the key vias in the coversheet 405. Layering under the coversheet may include material layers that are hydrophobic or have other properties. Though gaps between haptic keys and key vias may be minimized, such gaps may be useful for cooling ventilation of the base chassis or for allowing backlighting to frame the haptic keys. Similarly, a touchpad 402 top touch interface layer may be attached under the coversheet 405 to seamlessly provide a designated touchpad area in the C-cover 435 coversheet 405. Any combination of continuous coversheet for haptic keys and vias in the coversheet for placement of haptic keys of a keyboard coversheet layer 405 are contemplated in various embodiments. Further, it is contemplated that in some embodiments one or the other of a haptic keyboard or haptic touchpad may be used with a keyboard 400 having mechanically actuated keys 401 or a touchpad 402 with a mechanically actuated diving board mechanism. Any combination of the above coversheet 405 layouts described is contemplated in embodiments described herein.

The keyboard stack up 400 may further include a C-cover substructure 435 forming part of the base chassis with a cutout for keyboard 401 and touchpad 402. The C-cover substructure 435 may be made of a rigid material that prevents little or no movement. The rigidity of the C-cover substructure 435 allows the other layers within the keyboard 401 to be maintained within the information handling system. In an embodiment, the C-cover substructure 435 may be made of a metal.

The keyboard stack up 400, in an embodiment, may further include any number of adhesive layers 415. As described herein, one or more layers of the piezo haptic keyboard stack may operate to dissipate heat in a horizontal plane (e.g., along the surface of the first adhesive layer 415), rather than vertically (e.g., upward from the first adhesive layer 415 toward the coversheet 405). For example, the upper adhesive layer 415 or the lower adhesive layer 416 may be comprised of heat-dissipating adhesive materials. Such materials may include, for example, heat dissipating epoxies, silicones, or elastomeric materials. In some embodiments, an additional layer of phase change material may be disposed between the upper adhesive layer 415 and the contact foil layer 410. Such a phase change material may absorb heat propagated toward the coversheet 405 by moving from a solid to liquid state, thus mitigating any heat transfer toward the coversheet 405 into which a user may commonly come in contact. Examples of phase change materials in an embodiment may include non-paraffin organic materials, or hydrated salts. In such a way, embodiments of the present disclosure may mitigate closer placement between heat generating components of a mobile information handling system and the thinner mechanical or piezo haptic keyboard assemblies toward which the market is currently moving.

The contact foil layer 410 is adhered to the coversheet layer 405 via the first adhesive layer 415 may be made of any elastically resilient material that, when any given key is actuated or the contact foil layer 410 is bent towards a lower portion of the respective key, returns to its original state when the respective key is no longer being actuated. The contact foil layer 410 in some embodiments may include a number of metal traces at 445 on contact foil layer 410 formed on its surface that electrically and communicatively couples each of the keys and a corresponding piezoelectric element 420 to a keyboard controller 426 of an information handling system that includes a haptic feedback keyboard control system such as described in connection with FIGS. 1, 3A, 3B, and 3C. In another embodiment described with reference to FIG. 3C, the contact foil layer 410 may include a number of metal traces formed on its surface that electrically and communicatively couples each of a plurality of light emitting diodes to a light emitting diode (LED) controller of an information handling system.

For touchpad 402 in some embodiments, a capacitive touch layer (not shown) maybe attached under coversheet 405 above contact foil 410. The capacitive touch layer may include a grid of sense and drive lines which may operate as understood by those of skill in the art to detect X and Y locations of touch on touchpad 402 in an embodiment herein. The touchpad 402 may have otherwise similar layers to the keypad stack up 400 although an array of piezoelectric elements 420 will operate under a touchpad interface area.

In an embodiment, the keyboard (or touchpad) controller 426 may be a dedicated controller communicatively coupled to the contact foil layer 410 so as to detect piezo actuation signals from each of the piezoelectric elements 420 and provide haptic feedback control signals back to the respective piezoelectric elements 420. Keyboard controller 426 in some embodiments may execute some or all computer readable program code associated with the haptic feedback keyboard control system as described in FIG. 1. In an alternative embodiment, some or all of the keyboard controller 426 may be a processor of the information handling system that, among other computations and execution of other computer readable program code, also executes computer readable program code associated with the haptic feedback keyboard control system as described in FIG. 1.

During operation of each key on the keyboard 401, the contact foil layer 410 may receive a piezo actuation signal in the form of an electrical charge from the respective piezoelectric elements 420 as they are compressed upon actuation at the metal traces 445 that conduct the electrical charge to the controller 425 associated with the keyboard 400. The metal traces 445 formed on the bottom of contact foil layer 410 may further be used to conduct a haptic feedback control signal from the controller 425 to the piezoelectric elements 420 so that the piezoelectric elements 420 will stretch or contract in response to haptic feedback control signal and at varying polarities, voltages, or currents. This haptic feedback control signal transmitted to each of the actuated piezoelectric elements 420 may cause a haptic feedback event via upward or downward warping of the piezoelectric element 420 and presented at each of the keys or touchpad interface area that the user may feel. This haptic feedback may be relayed to the user within microseconds of the user actuating any of the keys on the keyboard 401 such that the user physically detects a sensation that the key was pressed. This sensation felt by the user may be present despite no actual mechanical devices such as a scissor mechanism or other types of keyboard mechanical devices being present among the layers of the keyboard 401.

The keyboard stack up 400 may further include a second adhesive layer 416 that mechanically couples the contact foil layer 410 to a spacer plate disposed across a vapor chamber 430 acting as a support plate, or simply a support plate in some embodiments, for the haptic keyboard assembly 400. In an embodiment, the second adhesive layer 416 may include the placement of an adhesive along borders of each piezoelectric element 420 of the keyboard stack up 400. As shown in FIG. 4, the second adhesive layer 416 includes circular voids that conform to a shape of each piezoelectric element 420 within the keyboard stack up 400. The vapor chamber 430 in embodiments may be a hollow chamber formed of heat-propagating material (e.g., copper) housing a pressurized fluid (e.g., water). As portions of the heat-propagating material forming the chamber increase in temperature, the pressurized fluid situated nearby turns from a liquid to vapor state, and moves to a cooler portion of the chamber, where it condenses back into liquid form, and transfers heat to surrounding structures (e.g., cooling fins or fans affixed to or placed adjacent the vapor chamber).

The vapor chamber 430 may be made of rigid material such as a metal. The vapor chamber 430 prevents deformation of the keyboard stack up 400 except for, in some embodiments, the contact foil layer 410, piezoelectric element 420, first adhesive layer 415, and second adhesive layer 416 as for operation of the haptic keys. As such, the contact foil layer 410 may be allowed to detect the deformation of the piezoelectric elements 420. Additionally, a user using the keyboard 401 may feel a level of rigidity in the keyboard 401 except that at the locations of the keys where the user has expected that some level of deformation occurs when pressure is applied to provide for key actuation of the piezoelectric element 420.

In an embodiment, the spacer plate disposed atop the vapor chamber 430 may include a number of cavities 431 formed therein. In other embodiments, vapor chamber 430 may have a plurality of cavities 431 formed in its top surface as shown. The cavities 431 may be sized to have a relatively smaller diameter than the diameter of each of the respective piezoelectric elements 420. By including these cavities 431, the piezoelectric elements 420 may be allowed to be deformed into the cavities 431 so that the deformation of the piezoelectric element 420 creates the electrical charge described herein. The metal plate of the piezoelectric elements 420 may have a diameter greater than cavities 431. Upon compression or contraction of the piezoelectric material portions, such as a ceramic disk of the piezoelectric element 420, the metal plate may warp into or away from the cavity 431. The depth of the cavities 431 may also be selected to allow for at least a central portion of each piezoelectric element 420 to be deflected into the cavities 431 some distance. This distance of deflection, in an embodiment, may be 0.1 mm or smaller or may be greater. In an embodiment, the cavities 431 may also be holes punched or machined through the spacer plate disposed atop the vapor chamber 430.

In an embodiment, the vapor chamber 430 may be secured to other rigid elements of the information handling system. In an embodiment, the vapor chamber 430 may be secured to the C-cover substrate 435 via a number of bolts, screws, or other mechanical or chemical coupling device as shown. In some embodiments, the vapor chamber 430 may be operatively coupled to the D-cover of the information handling system. The C-cover and D-cover assembly may form a base chassis also housing other components of an information handling system such as a CPU, GPU, memory, power and battery systems, wireless adapter, motherboards, graphics boards, other input/output systems and the like such as the components described with respect to FIG. 1.

Figure 5:
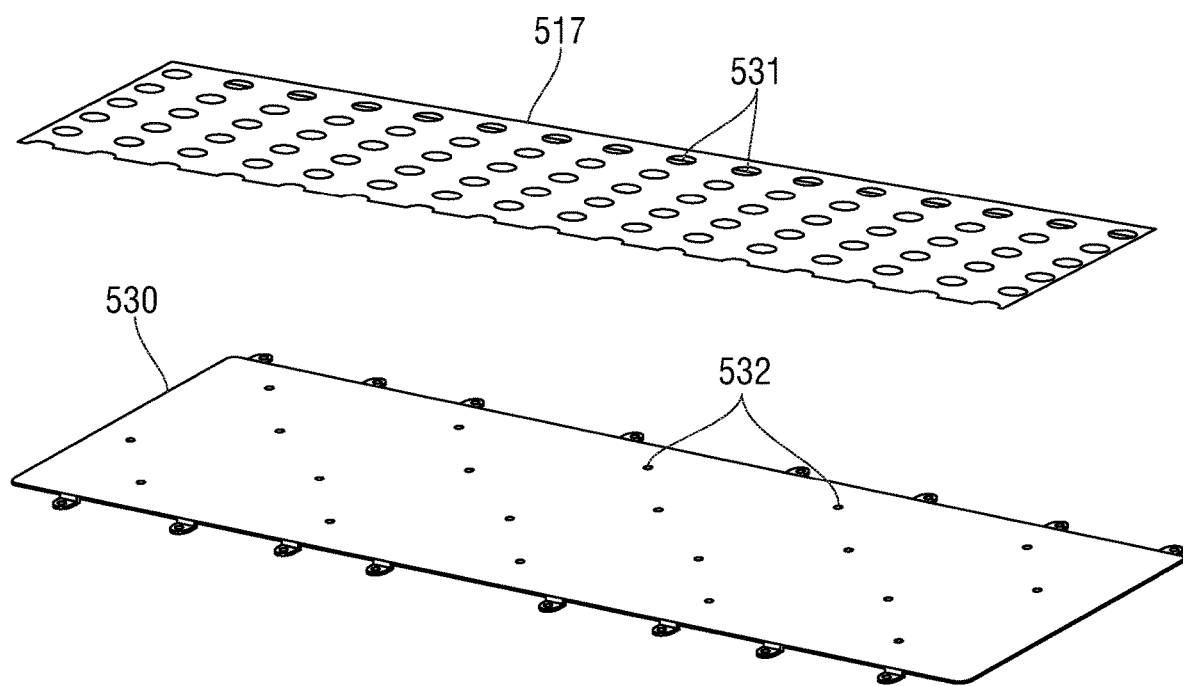
FIG. 5 is an exploded perspective graphical view of a spacer layer of a keyboard according to an embodiment of the present disclosure.

FIG. 5 is an exploded perspective graphical view of a spacer layer disposed atop a vapor chamber support plate of a keyboard according to an embodiment of the present disclosure. A spacer plate 517 in an embodiment may be disposed across the surface of a vapor chamber 530 acting as a support plate for the haptic keyboard. The vapor chamber 530 in embodiments may be a hollow chamber formed of heat-propagating material (e.g., copper) housing a pressurized fluid (e.g., water, or ammonia). As portions of the heat-propagating material forming the chamber increase in temperature, the pressurized fluid situated nearby turns from a liquid to vapor state, and moves to a cooler portion of the chamber, where it condenses back into liquid form, and transfers heat to surrounding structures (e.g., cooling fins or fans affixed to or placed adjacent the vapor chamber).

As described herein, the vapor chamber 530 may also provide stability, support, or rigidity for the other layers of the haptic keyboard assembly in an embodiment. The vapor chamber 530 in an embodiment may also incorporate a plurality of rigid column supports 532 providing additional structural support for the remaining layers of the haptic keyboard assembly keyboard assembly. The rigid column supports 532 in such an embodiment may be disposed within shallow vias disposed partially through the thickness of the top surface of the vapor chamber 530, and affixed with adhesives or other mechanisms known in the art. Rigid column supports 532 may be used to support or align the vapor chamber 530 and spacer 517.

One or more cavities 531 in an embodiment may be disposed within the top surface of the spacer layer 517. Such cavities 531 may extend partially through the thickness of the spacer layer 517 in some embodiments, and may extend completely through the thickness of the spacer layer 517 to form holes in the spacer layer 517 in other embodiments. As described herein, the piezoelectric elements may be housed over cavities 331 in embodiments, such as those described with reference to FIGS. 3A, 3B, 3C, and 4. The vapor chamber 530 and spacer plate 517 support deflection of the piezoelectric elements into the cavity 531 to detect mechanical actuation of the key.

Figure 6:
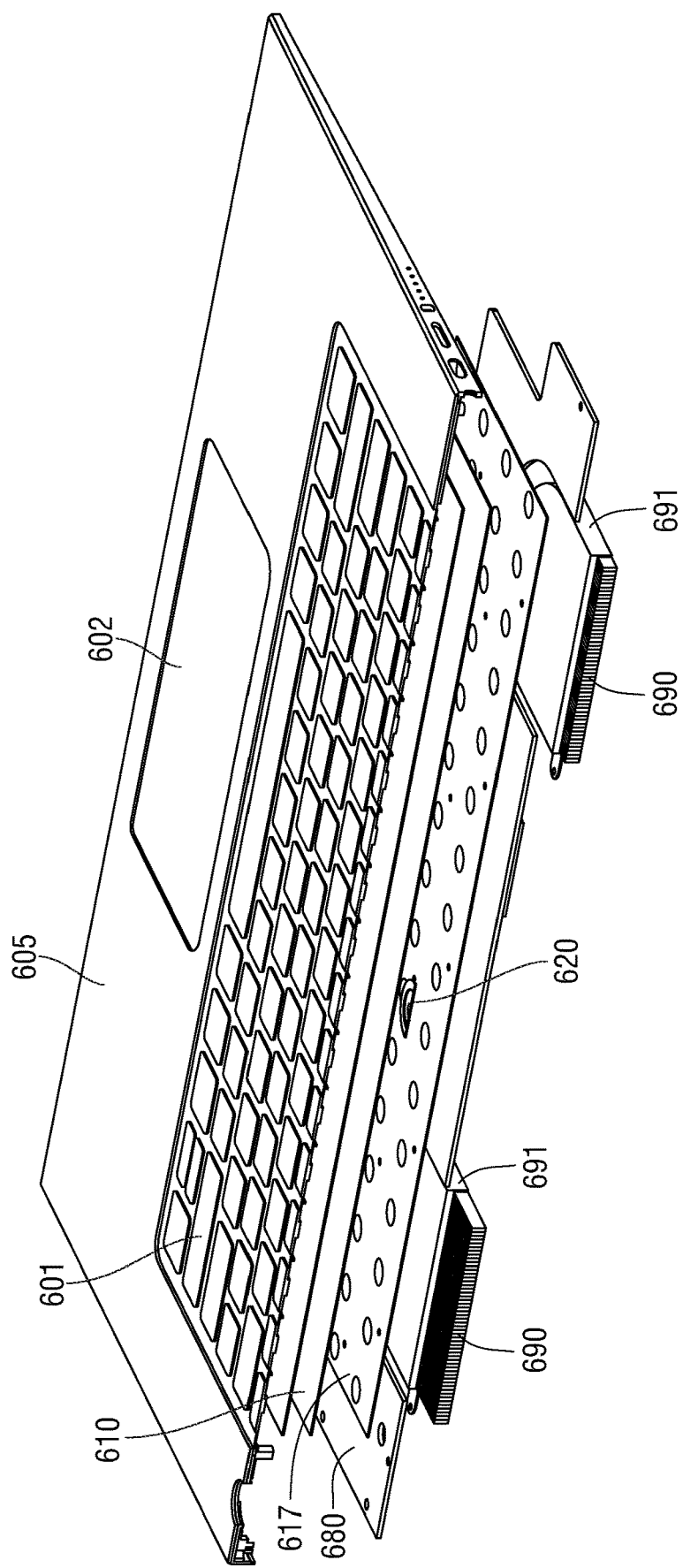
FIG. 6 is an exploded perspective graphical view of a directional heat dissipation system according to an embodiment of the present disclosure.

FIG. 6 is an exploded perspective graphical view of a directional heat dissipation system for a piezo haptic keyboard layer stack according to an embodiment of the present disclosure. FIG. 6 shows a top coversheet 605 having both a keyboard 601 and a touchpad 602. Either or both of the keyboard 401 and touchpad 402 may be haptic systems as described in embodiments herein. In one embodiment, described with reference to FIG. 3A, the coversheet layer 605 may comprise a single continuous layer of material. Coversheet layer 605 in such an embodiment may include a plurality of key designations, such as key pedestals as shown in keyboard 601 and a touchpad 602 area designation. In other embodiments, such as those described with reference to FIGS. 3B and 3C, the coversheet of the C-cover may include a plurality of vias (not shown) for keys 601 having a cover sheet 605 or cap for each key 601. A key pedestal for each key 601 in a solid-state keyboard of the present embodiments may be disposed through a lattice of the vias in the C-cover, such as with conventional keyboards, in such embodiments.

In an embodiment, a contact foil layer 610 may be adhered to the coversheet layer 605 and may be made of any elastically resilient material that, when any given key is actuated or the contact foil layer 610 is bent towards a lower portion of the respective key, returns to its original state when the respective key is no longer being actuated. The contact foil layer 610 in some embodiments may include a number of metal traces on contact foil layer 610 formed on its surface that electrically and communicatively couples each of the keys and a corresponding piezoelectric element 620 (part of one shown as an example) to a keyboard controller (not shown) of an information handling system that includes a haptic feedback keyboard control system such as described in connection with FIGS. 1, 3A, 3B, and 3C. A full array of piezoelectric elements, adhesive layers, and controllers are not shown in FIG. 6 for simplification of the illustration to enable other layers to be seen. Some or all layers shown in other embodiments may be utilized with the embodiment if FIG. 6. In another embodiment described with reference to FIG. 3C, the contact foil layer 610 may include a number of metal traces formed on its surface that electrically and communicatively couples each of a plurality of light emitting diodes to a light emitting diode (LED) controller of an information handling system.

A spacer plate 617 may be disposed between a contact foil layer 610 and a vapor chamber shown coupled to and situated directly beneath the spacer plate 617 acting as a support structure for the piezo haptic keyboard assembly in an embodiment. The vapor chamber in FIG. 6 is eclipsed by the attached spacer plate 617 but can be seen through the cavities 631. In an embodiment, the spacer plate 617 disposed atop the vapor chamber may include a number of cavities 631 formed therein. The cavities 631 may be sized to have a relatively smaller diameter than the diameter of each of the respective piezoelectric elements. By including these cavities 631, the piezoelectric elements may be allowed to be deformed into the cavities 631 so that the deformation of the piezoelectric element creates the electrical charge described herein. In an embodiment, the cavities 631 may also be holes punched or machined through the spacer plate disposed atop the vapor chamber. In other embodiments as described herein, the vapor chamber may have cavities 631 debossed or otherwise formed in its top surface to function similarly to the cavities 631 shown formed in spacer plate 617.

In an embodiment, the vapor chamber and spacer plate 617 (if any) may be secured to other rigid elements of the information handling system. For example, the vapor chamber may be secured to the motherboard 680 of the information handling system, as well as one or more heat dissipating fins 690 operably coupled to fans 691. The vapor chamber in such an embodiment may operate to dissipate heat generated by the motherboard 680 horizontally toward the fins 690 to be exhausted via fans 691, rather than vertically toward the spacer layer 617 or other layers of the keyboard stackup, including the coversheet 605 with which the user may come into contact. In another embodiment, the vapor chamber 630 may be secured to the C-cover substrate via a number of bolts, screws, or other mechanical or chemical coupling device such as shown in FIG. 4. In some embodiments, the vapor chamber 630 may be operatively coupled to the D-cover of the information handling system. The C-cover and D-cover assembly may form a base chassis also housing other components of an information handling system such as a CPU, GPU, memory, power and battery systems, wireless adapter, motherboards, graphics boards, other input/output systems and the like such as the components described with respect to FIG. 1.

Figure 7:
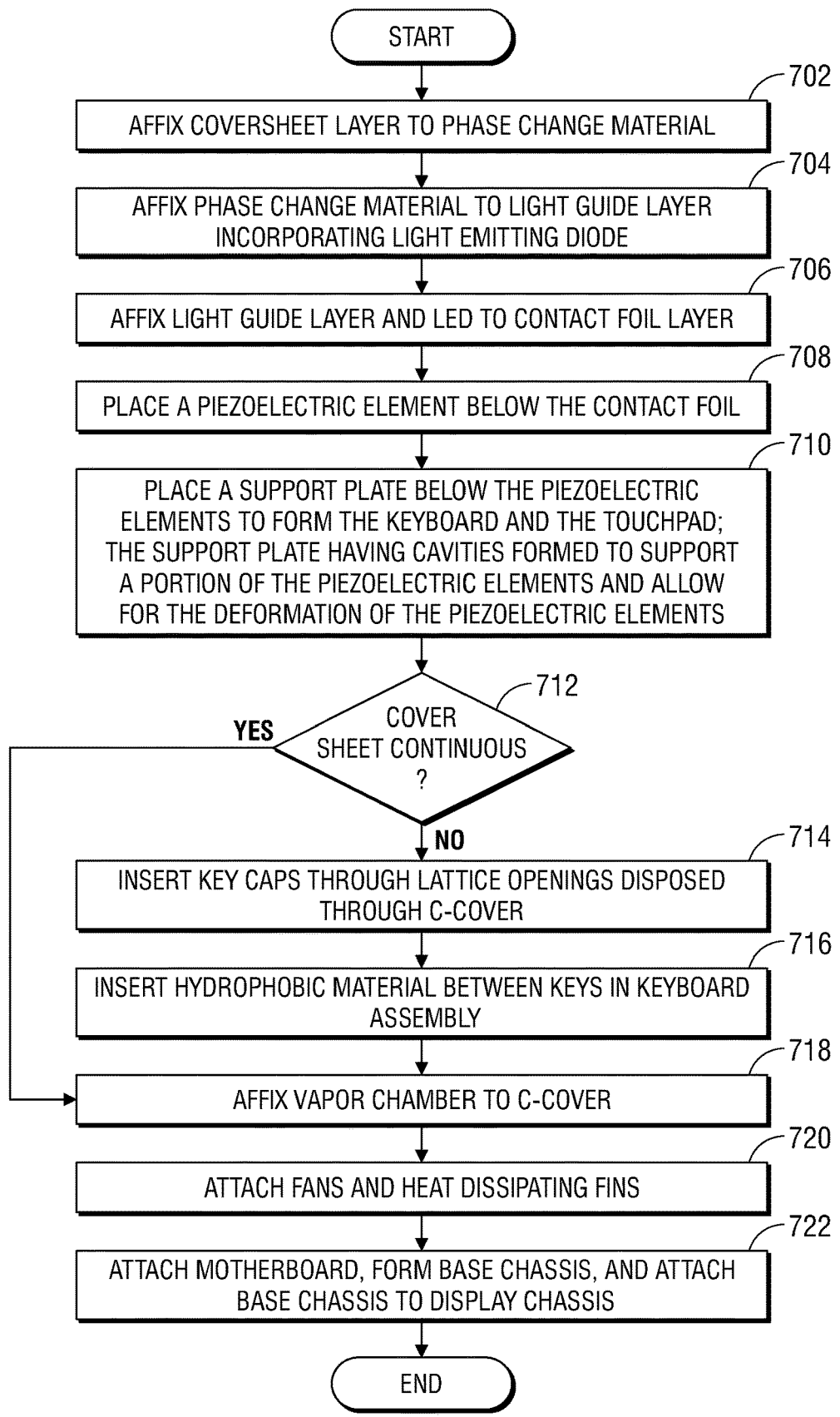
FIG. 7 is a flow diagram illustrating a method of manufacturing a directional heat-dissipation system keyboard assembly according to an embodiment of the present disclosure.

FIG. 7 is a flow diagram illustrating a method of manufacturing a directional heat-dissipation system for a haptic keyboard assembly according to an embodiment of the present disclosure. As described herein, a system is needed to dissipate heat away from heat producing components of an information handling system without increasing the vertical distance between these components and the palm rest in the C-cover (e.g., without increasing the thickness of the base chassis). Embodiments of the present disclosure may address this issue by dissipating heat via a vapor chamber acting as the bottom support plate for the haptic keyboard assembly toward one or more cooling mechanisms (e.g., fans or fins) placed along an exterior vertical edge of the base chassis, and away from the palm rest in the C-cover. Other mechanisms may also be employed either alone or in conjunction with such a directional heat dissipating structure, such as phase change materials and hydrophobic materials.

At block 702, an individual key cap cover layer may be affixed to a phase change material in an embodiment. For example, in embodiments described with reference to FIGS. 3B and 3C, the C-cover 309 may include a plurality of vias for keys 300 having a cover sheet 305 or cap for each key. Each haptic key of the haptic keyboard in such an embodiment may include a cover layer 305 with portions (e.g., pedestal 306) that protrude through the key vias in the C-cover 309. The coversheet 305 in embodiments described with reference to FIGS. 3B and 3C may be affixed to a phase change material 318 via adhesive layer 315. Such a phase change material 318 may absorb heat propagated toward the coversheet 305 by moving from a solid to liquid state, thus mitigating any heat transfer toward the C-cover 309 into which a user may commonly come in contact. Examples of phase change materials in an embodiment may include non-paraffin organic materials, or hydrated salts. In such a way, embodiments of the present disclosure may mitigate closer placement between heat generating components of a mobile information handling system and the thinner mechanical or piezo haptic keyboard assemblies toward which the market is currently moving.

At block 704, in an embodiment, the phase change material may be affixed to a light guide layer incorporating a light emitting diode. The method may proceed to block 706 for further inclusion of a light guide layer and LED. For example, in an embodiment described with reference to FIG. 3C, incorporating a mechanical key of a traditional keyboard, a light guide layer 319 including a light emitting diode (LED) 391 may be disposed between the phase change material 318 and the contact foil 310. The light guide layer in an embodiment may operate to guide light emitted from the LED 391 toward translucent portions of the key pedestal 306 or to openings formed between the key pedestal 306 and the C-cover 309 for a backlighting effect. If LED or light guide layer is not incorporated, the method instead include a step where the phase change material may be affixed onto a contact foil layer.

With the light guide layer included in an embodiment, the light guide layer and LED may be affixed and operably coupled to the contact foil layer at block 706. For example, in an embodiment described with reference to FIG. 3C, the contact foil 310 in may be adhered to a bottom surface of a light guide layer 319. The contact foil 310 may be made of any elastically resilient material that, when the coversheet 305 of key 300 is actuated or the contact foil 310 is bent towards a lower portion of the key 300, returns to its original state when the key 300 is no longer being actuated. The contact foil 310 may include a number of metal traces formed on one or more of its surfaces. The metal traces of the contact foil 310, on the top side of contact foil 310 in the embodiment such as illustrated in FIG. 3C, may electrically and communicatively couple the LED 391 to an LED controller.

At block 708, a piezoelectric element may be disposed below the contact foil in an embodiment. For example, in embodiments described with reference to FIGS. 3A, 3B and 3C, the piezoelectric element 320 may be disposed below the contact foil 310. The contact foil 310 in such embodiments may include a number of metal traces formed on one or more of its surfaces that may electrically and communicatively couple each of the corresponding piezoelectric element 320 of key 300 to a keyboard controller such as a processor of an information handling system that includes a haptic feedback keyboard control system such as described herein.

In such embodiments, the piezoelectric element 320 may include a first portion 322 that may be any solid piezoelectric material that accumulates an electric charge when a mechanical stress is applied to it or specifically, in the embodiments presented herein, when the solid material is deformed. Solid materials used to form the piezoelectric disk 322 or other piezoelectric material as part of a first portion 322 of the piezoelectric element 320 may include crystals, ceramics, biological matter, protein layers, among other types of materials.

The piezoelectric element 320 illustrated in FIGS. 3A, 3B, and 3C may comprise two portions 322 and 325 each electrically coupled via electric contact points such as soldering points 335 and 340, respectively, to a different electrical trace on the surface of the contact foil 310. The first portion 322 may be a ceramic disk in an embodiment. Second portion 325 of the piezoelectric element 320 may be a metal plate or ring, such as a brass plate, that extends beyond the edges of cavity 331. The first soldering point 335 and second soldering point 340 may be formed to receive an electrical charge (e.g., a piezo actuation signal) upon deflection of the piezoelectric element 320 as a user actuates the key 300. The brass plate 325 supports deflection of the piezoelectric element 320 into the cavity 331 to detect mechanical actuation of the key 300.

A support plate or vapor chamber acting as a support plate may be placed below the piezoelectric element to form the keyboard and the touchpad in an embodiment at block 710. For example, in an embodiment described with reference to FIG. 3A, a spacer plate 317 may be affixed to the bottom surface of the contact foil 310 via lower adhesive layer 316 and a vapor chamber 330 may be disposed beneath the spacer plate 317 and the piezoelectric element 320. As another example, in an embodiment described with reference to FIG. 3B, a support plate 332 may be adhered to the cover sheet 310 via lower adhesive layer 316 and situated beneath the piezoelectric element 320. As another example, in an embodiment described with reference to FIG. 3C, a vapor chamber 330 may have cavities 331 debossed or otherwise formed in the top of vapor chamber 330 and adhered to contact foil 310 via lower adhesive layer 316. It is understood that any embodiment of vapor chamber 330 and spacer plate 317, support plate 332, or vapor chamber 330 with cavities 331 debossed in the top surface may be used with any key stack up embodiment shown in any of FIGS. 3A, 3B, 3C, or otherwise described in various embodiments herein.

In such embodiments, the support plate 332 or spacer plate 317 situated atop or cavities 331 debossed into the vapor chamber 330 may have cavities 331 formed therein to support a portion of the piezoelectric elements 320 and allow for the deformation of the piezoelectric elements 320 within the cavities 331. For example, in an embodiment described with reference to FIG. 3A, the cavity 331 may be an aperture or hole through spacer plate 317 or may be a depression or hole in spacer plate 317 that does not pass through 317. As another example, in an embodiment described with reference to FIG. 3B, the cavity 331 may be a via formed in a support plate 332 for a piezo haptic keyboard assembly. As yet another example, in an embodiment described with reference to FIG. 3C, the cavity 331 may be debossed or otherwise formed in a surface of vapor chamber 330 for a piezo haptic keyboard assembly.

At block 712, a determination is made whether the haptic keyboard stack up utilizes a continuous coversheet with key designations and a touchpad area designation such as in an embodiment of FIG. 3A, or if the keys pedestals will be disposed partially or wholly through vias in a lattice of the C-cover top layer similar to a more conventional keyboard. If at block 712, the coversheet is a continuous coversheet with key designations and a touchpad area designation such as in an embodiment of FIG. 3A for the current information handling system model, flow may proceed to block 718 to affix the vapor chamber in some embodiments, or support plate in embodiments not using a vapor chamber. If at block 712, the coversheet are for key pedestals for individual keys and meant to be disposed through key vias in a top cover of the C-cover such as shown in example embodiments of FIGS. 3B and 3C, flow may proceed to block 714.

At block 714, the key pedestals are disposed through the lattice openings in a top cover of the C-cover. Similarly, a touchpad interface surface may be aligned with a touchpad via in the C-cover top layer for access by a user. With the use of the lattice of vias, some additional ventilation through small gaps between the key pedestals and the via openings may be available. However, the amount of heat allowed to dissipate may be limited due to the user's contact with key and touchpad surfaces. The heat dissipation measures described herein may mitigate that, but nonetheless some ventilation benefit may be realized. Further, the small gaps may also have a backlighting use to frame the keys around the gaps between the key pedestals and the via openings in other embodiments.

In some embodiments at block 716, a hydrophobic layer may be utilized to prevent liquid from spills or other reasons from penetrating the gaps between the key pedestals and the vias of the lattice in the top layer of the C-cover as described. The hydrophobic layer may be disposed on the underside of the top layer of the C-cover and along the lattice structure before disposing and affixing the haptic keys through the lattice of vias in one example embodiment. In another example embodiment, the hydrophobic material layer may be disposed on the coversheet of the plural haptic keys of the haptic keyboard between key pedestals before disposing and affixing the haptic keys through the lattice of vias. In yet another embodiment, the hydrophobic material layer may be injected between the keys of the keyboard assembly to create a water resistant layer in the gap between the key pedestals and the vias in the C-cover. For example, a hydrophobic material 307 may be injected or otherwise disposed between the coversheet layer 305 and the key pedestal disposed through the via in the C-cover top layer 309 of FIGS. 3B and 3C. Such a hydrophobic material 307 in an embodiment may provide the dual purposes of dissipating heat and repelling liquids that could harm the components of the keyboard assembly.

At block 718 to affix the vapor chamber in some embodiments, or support plate in embodiments not using a vapor chamber. For example, in an embodiment described with reference to FIGS. 3A and 3C, the vapor chamber 330 may provide structural support for the haptic keyboard assembly, and may be affixed below the contact foil layer 310 and the piezoelectric elements 320. The vapor chamber 330 in embodiments may be a hollow chamber formed of heat-propagating material (e.g., copper) housing a pressurized fluid (e.g., water). As portions of the heat-propagating material forming the chamber increase in temperature, the pressurized fluid situated nearby turns from a liquid to vapor state, and moves to a cooler portion of the chamber, where it condenses back into liquid form, and transfers heat to surrounding structures (e.g., cooling fins or fans affixed to or placed adjacent the vapor chamber).

As another example, in an embodiment described with reference to FIG. 6, the vapor chamber, shown operably coupled to but situated beneath and eclipsed by the spacer plate 617, may be secured between the cover sheet 610 and the motherboard 680 of the information handling system, as well as one or more heat dissipating fins or fans 690. The vapor chamber in such an embodiment may operate to dissipate heat generated by the motherboard 680 horizontally toward the fins/fans 690, rather than vertically toward the spacer layer 617 or other layers of the keyboard stackup, including the coversheet 605 with which the user may come into contact.

The vapor chamber or support plate may be affixed to the C-cover at block 718 in an embodiment. For example, in an embodiment described with reference to FIG. 4, the vapor chamber 430 may be secured to the C-cover substrate 435 via a number of bolts, screws, or other mechanical or chemical coupling device. In some embodiments, the vapor chamber 430 may be operatively coupled to the D-cover of the information handling system.

In other embodiments at block 720, the vapor chamber may be thermally coupled to heat dissipating fins and exhaust fans as shown above and described with respect to FIG. 6. Thermal adhesive, or contact coupling may be used in some embodiments. In other embodiments, bolts, screws, or other mechanical or chemical coupling devices may be used to thermally couple the heat dissipating fins or exhaust fans to the vapor chamber as understood by those of skill.

Proceeding to block 722, the motherboard may be attached to the exhaust fans and heat dissipating fins, as well as any thermal heat sink or heat guides used according to methods as understood by those of skill. Further, the C-cover and D-cover assembly may form a base chassis also housing other components of an information handling system such as a CPU, GPU, memory, power and battery systems, wireless adapter, motherboards, graphics boards, other input/output systems and the like such as the components described with respect to FIG. 1. As another example, in an embodiment described with reference to FIG. 6, the vapor chamber 630, or the motherboard 680 may be secured to the C-cover substrate via a number of bolts, screws, or other mechanical or chemical coupling device. In some embodiments, the vapor chamber 630, or the motherboard 680 may be operatively coupled to the D-cover of the information handling system. The base chassis of the C-cover and D-cover assembly may further be hingedly coupled to a display chassis in embodiments herein. In such a way, embodiments of the present disclosure may mitigate closer placement between heat generating components of a mobile information handling system and the thinner mechanical or piezo haptic keyboard assemblies toward which the market is currently moving.

Figure 8:
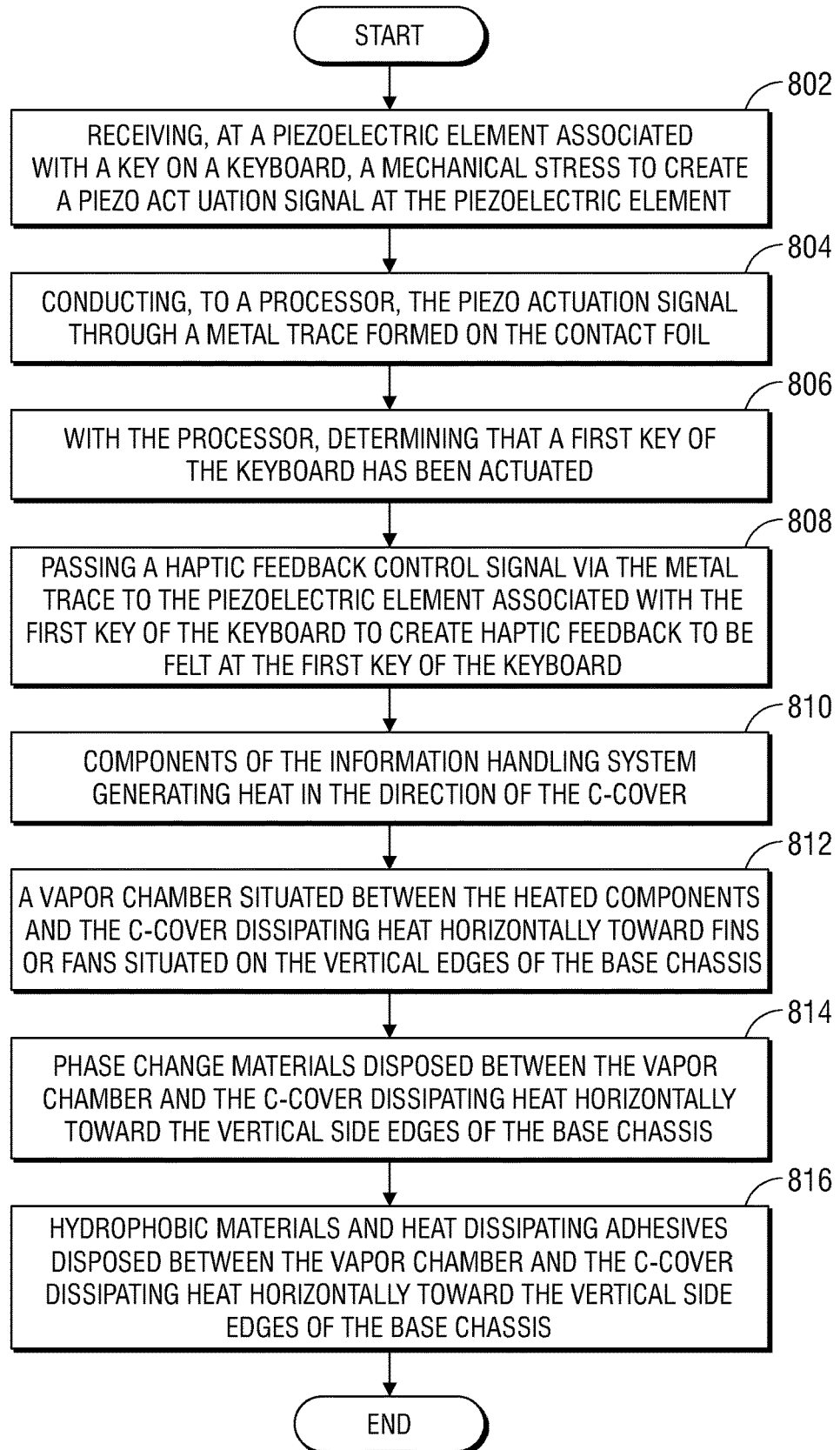
FIG. 8 is a flow diagram illustrating a method of dissipating heat away from an information handling system C-cover with haptic keyboard according to an embodiment of the present disclosure.

FIG. 8 is a flow diagram illustrating a method of dissipating heat generated by internal components of an information handling system away from the information handling system C-cover according to an embodiment of the present disclosure. As described herein, the decrease in thickness resulting from use of a piezoelectric haptic keyboard system (or other mechanical keyboards designed to be ultra-thin) may place the top surface of a laptop base (e.g., C-cover), upon which a user rests her palms while typing, closer to heat producing components housed in the laptop base chassis than thicker chasses of previous systems. A system is needed to dissipate heat away from such heat producing components without increasing the vertical distance between these components and the palm rest in the C-cover (e.g., without increasing the thickness of the base chassis). Embodiments of the present disclosure address this issue by dissipating heat via a vapor chamber acting as the bottom support plate for the haptic keyboard assembly toward one or more cooling mechanisms (e.g., fans or fins) placed along an exterior vertical edge of the base chassis, or via other mechanisms dissipating heat toward the vertical edges of the base chassis and away from the palm rest in the C-cover.

At block 802, the method may begin by receiving, at a piezoelectric element associated with a key on a keyboard, a mechanical stress to create a piezo actuation signal at the piezoelectric element. For example, in an embodiment described with reference to FIG. 3A, or FIG. 3B, a piezoelectric element 320 may be situated beneath a key pedestal 306. The piezoelectric element 320 in such embodiments may include a first portion 322 comprising a solid material (e.g., crystals, ceramics, biological matter, protein layers) that accumulates an electric charge when a mechanical stress is applied to it or when the solid material is deformed. The piezoelectric element 320 may be housed over a cavity 331 formed in the spacer plate 317 or the support plate 332. A mechanical stress applied to the key pedestal 306, and thus, to the piezoelectric element 320 may cause deformation of the ceramic disc 322 and the metal plate or ring 325 comprising the piezoelectric element 320 into the cavity 331.

The method may continue, at block 804, with conducting, to a processor, the piezo actuation signal through a metal trace formed on a contact foil. For example, in an embodiment described with reference to FIGS. 2A, and 2B, the piezoelectric element 320 may be electrically and communicatively coupled at a first portion 322 to a metallic trace formed on a surface of a contact foil 310 by a first soldering point 335 and at a second portion 325 to a metallic trace in contact foil 310 via a second soldering point 340. The first soldering point 335 and second soldering point 340 may be formed to receive the piezo actuation signal upon deflection of the piezoelectric element 320 as a user actuates the key 300. The contact foil 310 may include a number of metal traces formed on its surface that electrically and communicatively couple each of the corresponding piezoelectric elements 320 of key 300 of the keyboard to a controller or a processor of an information handling system that includes a haptic feedback keyboard control system such as described herein. During operation of the key 300, the contact foil 310 may receive the piezo actuation signal from the piezoelectric element 320 at the metal traces and conduct the piezo actuation signal to the processor or other keyboard controller associated with the key 300. For example, as the piezoelectric disk material 322 is compressed by deflection and the metal plate or ring 325 warped downward, a change in voltage may be detected. The piezo actuation signal created when the user actuates the key 300 with the user's finger and the piezoelectric element 320 is subjected to a mechanical stress may be detected between soldering points 335 and 340. The piezo actuation signal may be communicated down metal traces formed on the surface of the contact foil 310 to a keyboard controller.

The method may continue at block 806 with determining via the haptic keyboard controller or another processor, that a first key of the keyboard has been actuated. This determination may be made based on the piezo actuation signal that the processor receives from one or more specific metal traces formed on the surface of the contact foil. Alternative embodiments may be used to allow the keyboard controller or another processor to determine which key on the keyboard generated the piezo actuation signal. For example, in an embodiment described with reference to FIG. 4, the contact foil layer 410 may include a number of metal traces formed on its bottom surface that electrically and communicatively couple each of the keys and a corresponding piezoelectric element 420 to a keyboard controller 425 of an information handling system that includes a haptic feedback keyboard control system such as described in connection with FIG. 1. In an embodiment, the keyboard controller 425 may be a dedicated controller 425 communicatively coupled to the metal traces formed in the surface of the contact foil layer 410 so as to detect piezo actuation signals from each of the piezoelectric elements 420 and provide haptic feedback control signals back to the respective piezoelectric elements 420. Keyboard controller 425 executes some or all of the computer readable program code associated with the haptic feedback keyboard control system as described in FIG. 1. In an alternative embodiment, the keyboard controller 425 may be a processor of the information handling system that, among other computations and execution of other computer readable program code, also executes computer readable program code associated with the haptic feedback keyboard control system as described in FIG. 1. During operation of each key on the keyboard 401, the metal traces 445 on the surface of the contact foil layer 410 may receive a piezo actuation signal from the respective piezoelectric elements 420 as they are compressed upon actuation at the metal traces 445 that conduct the electrical charge to the controller 425 associated with the keyboard 400. Upon receiving the electric charge from the trace, the controller 425 may interpret the charge from the designated key as a keycode associated with one or more alphanumeric characters or functions. Similarly, with piezoelectric actuation signals received from piezoelectric elements associated with a haptic touchpad which may further be linked to x,y location from a capacitive touch layer to determine selection of a location on a screen or an auxiliary function or key character.

The method may continue at block 808 with passing a haptic feedback control signal to the piezoelectric element associated with the first key of the keyboard to create haptic feedback event to be felt at the first key of the keyboard. As described herein, the haptic feedback results from the electrical haptic response control signal, at a determined voltage, current, or polarity being applied to the piezoelectric material layer. The response signal may be a sine wave, a square wave, pulsed signal, or otherwise varied and modulated to create a haptic event of a key press for the user. Application of the haptic feedback control signal to the piezoelectric material layer causes the piezoelectric material layer to stretch, compress, or return to its non-deformed state in some embodiments. The new stretched or compressed state of the piezoelectric material layer may create a haptic bump or other haptic feedback movement to be felt by the user at the key actuated on the keyboard when the piezoelectric element metal plate layer is warped by the piezoelectric material compressing or stretching in response to the haptic feedback signal. In one example embodiment, changing polarity and voltage levels in any portion of a haptic feedback control signal may cause an expansion of the piezoelectric material causing it to stretch and a warping the metal plate layer into the underlying cavity. This may be followed by a haptic feedback control signal of polarity and voltage level to compress of the piezoelectric material and warp the metal plate away from the cavity. In this way, a haptic event may mimic a mechanical keystroke at the actuated key on as feedback to a user's finger. Any combination of the above changes to the piezoelectric material may be generated by the haptic feedback signal for causing the metal plate to warp and generate the intended haptic feedback event.

At block 810, components of the information handling system may generate heat in the direction of the C-cover. For example, in an embodiment described with reference to FIG. 6, the motherboard 680, or other components situated beneath the vapor chamber and spacer plate 617 may generate substantial heat. Components such as a GPU, CPU, power source, controllers, radio frequency transmitters, or others may generate substantial heat during operation. Such heat may emanate in all directions, including toward the coversheet 605 in which a user's hands may come into close or prolonged contact.

The method may continue at block 812 with a vapor chamber situated between the heated components and the C-cover dissipating heat horizontally toward fins or fans situated on the vertical edges of the base chassis. For example, in an embodiment described with reference to FIG. 6, a vapor chamber shown operatively coupled and situated directly beneath spacer plate 617 and eclipsed by the same may be secured to the motherboard 680 of the information handling system, as well as one or more heat dissipating fins or fans 690. The vapor chamber in such an embodiment may operate to dissipate heat generated by the motherboard 680 horizontally toward the fins/fans 690, rather than vertically toward the spacer layer 617 or other layers of the keyboard stackup, including the coversheet 605 with which the user may come into contact. As another example, in an embodiment described with reference to FIGS. 3A and 3C, the vapor chamber 330 may be a hollow chamber formed of heat-propagating material (e.g., copper) housing a pressurized fluid (e.g., water). As portions of the heat-propagating material forming the vapor chamber 330 increase in temperature, the pressurized fluid situated nearby turns from a liquid to vapor state, and moves to a cooler portion of the vapor chamber 330, where it condenses back into liquid form, and transfers heat to surrounding structures (e.g., cooling fins or fans affixed to or placed adjacent the vapor chamber).

At block 814, the method may continue with a phase change material disposed between the vapor chamber and the C-cover dissipating heat horizontally toward the vertical edges of the base chassis. For example, in embodiments described with reference to FIGS. 3A, 3B, and 3C, a phase change material 318 may be disposed between the vapor chamber 330 (or a support plate 332) and the C-cover 307 (or coversheet 305). Such a phase change material 318 in an embodiment may absorb heat propagated toward the coversheet 305 by moving from a solid to liquid state, thus mitigating any heat transfer toward the coversheet 305 into which a user may commonly come in contact. Examples of phase change materials in an embodiment may include non-paraffin organic materials, or hydrated salts.

The method may continue at block 816 with hydrophobic materials and heat dissipating adhesives disposed between the vapor chamber and the C-cover dissipating heat horizontally toward the vertical edges of the base chassis. For example, in embodiments described with reference to FIGS. 3A, 3B, and 3C the key 300 may further include a number of adhesive layers 315 that physically couple the various layers of the key 300 together. In an embodiment, a first adhesive layer 315 may be formed on the coversheet 305 to adhere the coversheet 305 to a phase change material layer 318. The upper adhesive layer 315 or the lower adhesive layer 316 may be comprised of heat-dissipating adhesive materials. Such materials may include, for example, heat dissipating epoxies, silicones, or elastomeric materials. As another example, in embodiments described with reference to FIGS. 3B and 3C, a hydrophobic material 307 may be injected between the coversheet 305 and the C-cover 309. Such a hydrophobic material 307 may also be comprised of heat-dissipating materials, and may operate to dissipate heat horizontally, away from the C-cover 309. The method may then end. In such a way, embodiments of the present disclosure may mitigate closer placement between heat generating components of a mobile information handling system and the thinner mechanical or piezo haptic keyboard assemblies toward which the market is currently moving.

The blocks of the flow diagrams of FIGS. 7-8 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An integrated heat dissipation system for a haptic piezoelectric keyboard of an information handling system comprising:
    a base chassis formed of a C-cover affixed to a D-cover to house the haptic piezoelectric keyboard assembly, a processor, and a heat dissipating layer;
    the heat dissipating layer thermally coupled to a haptic piezoelectric keyboard assembly and the processor to direct heat away from the keys of the piezoelectric keyboard of the C-cover and toward a vertical edge of the base chassis;
    the piezoelectric keyboard assembly comprising:
        a plurality of piezoelectric sensors disposed across a support plate;
        a contact foil layer, for detecting deformation of one of the plurality of piezoelectric sensors and registering a keystroke, affixed to the plurality of piezoelectric sensors and the support plate and provide a haptic feedback control signal to generate a haptic response to the keys of the piezoelectric keyboard;
    wherein the contact foil layer is affixed to a bottom surface of the C-cover.

2. The integrated heat dissipation system of claim 1, wherein the thermally coupled heat dissipating layer of the haptic piezoelectric keyboard assembly is a vapor chamber serving as the support plate.

3. The integrated heat dissipation system of claim 2, wherein the piezoelectric keyboard assembly further comprises:
    a spacer plate with a plurality of cavity holes operatively coupled between vapor chamber and the piezoelectric elements to allow deformation of the piezoelectric elements into the cavity holes.

4. The integrated heat dissipation system of claim 2, wherein the piezoelectric keyboard assembly further comprises:
    a plurality of cavity holes debossed in a top surface of the vapor chamber and disposed under the piezoelectric elements to allow deformation of the piezoelectric elements into the cavity holes.

5. The integrated heat dissipation system of claim 1, wherein the thermally coupled heat dissipating layer of the haptic piezoelectric keyboard assembly is a hydrophobic material layer injected between a coversheet of the haptic piezoelectric keyboard assembly and the C-cover.

6. The integrated heat dissipation system of claim 1, wherein thermally coupled heat dissipating layer of the haptic piezoelectric keyboard assembly is a heat dissipating adhesive material layer to affix the contact foil layer to the plurality of piezoelectric sensors and the support plate.

7. The integrated heat dissipation system of claim 6, wherein the heat dissipating adhesive material layer is a heat dissipating epoxy.

8. The integrated heat dissipation system of claim 1, wherein the thermally coupled heat dissipating layer of the haptic piezoelectric keyboard assembly is a layer of phase-change material disposed between the contact foil layer and a coversheet of the piezoelectric keyboard assembly.

9. A method of assembling a heat dissipation system integrated with a haptic piezoelectric keyboard for an information handling system comprising:
    disposing each of a plurality of piezoelectric sensors across one of a plurality of cavities formed between the piezoelectric sensors and a vapor chamber;
    affixing a contact foil layer operably coupled to the plurality of piezoelectric sensors to fix the position of each of the plurality of piezoelectric sensors with respect to the contact foil layer and edges of the cavities supporting the piezoelectric sensors;
    operably connecting a keyboard controller to each of the plurality of piezoelectric sensors via tracers on a surface of the contact foil layer to receive actuation signals and deliver return haptic feedback control signals to generate haptic events at keys of the haptic piezoelectric keyboard;
    affixing the contact foil layer to a bottom surface of a coversheet of an assembly of the haptic piezoelectric keyboard;
    affixing the vapor chamber to a base chassis formed of a C-cover and a D-cover to dissipate heat horizontally away from the coversheet and keys of the haptic piezoelectric keyboard; and
    operably connecting the controller to a processor.

10. The method of claim 9 further comprising:
    operatively coupling a spacer plate atop the vapor chamber and below the piezoelectric elements, with holes in the spacer plate to form the plurality of cavities formed between the piezoelectric sensors and a vapor chamber.

11. The method of claim 9 further comprising:
debossing the plurality of cavities into a top surface of the vapor chamber.

12. The method of claim 9 further comprising:
disposing a hydrophobic material between the coversheet of the assembly of the haptic piezoelectric keyboard and the C-cover top surface having a lattice through which key pedestals of the keys are disposed.

13. The method of claim 12, wherein the hydrophobic material is a perfluoroalkyl.

14. The method of claim 9 further comprising:
affixing the contact foil layer to a bottom surface of a layer of phase change material; and
affixing the top surface of the layer of phase change material to a coversheet of the assembly of the haptic piezoelectric keyboard so the phase change material is disposed between the contact foil layer and the coversheet.

15. An integrated heat dissipation system for a haptic piezoelectric keyboard of an information handling system comprising:
a base chassis formed of a C-cover affixed to a D-cover to house the haptic piezoelectric keyboard assembly, a processor, and a vapor chamber support layer;
the vapor chamber support layer thermally coupled to a haptic piezoelectric keyboard assembly and the processor to direct heat away from keys of the piezoelectric keyboard of the C-cover and toward a vertical edge of the base chassis;
the piezoelectric keyboard assembly comprising:
a plurality of piezoelectric sensors disposed across the vapor chamber support layer;
a contact foil layer, for detecting deformation of one of the plurality of piezoelectric sensors and registering a keystroke, affixed to the plurality of piezoelectric sensors and the vapor chamber support layer and to provide a haptic feedback control signal to generate a haptic response to the keys of the piezoelectric keyboard;
wherein the contact foil layer is affixed to a bottom surface of the C-cover.

16. The integrated heat dissipation system of claim 15, wherein the piezoelectric keyboard assembly further comprises:
a spacer plate with a plurality of cavity holes operatively coupled between vapor chamber support layer and the piezoelectric elements to allow deformation of the piezoelectric elements into the cavity holes.

17. The integrated heat dissipation system of claim 15, wherein the piezoelectric keyboard assembly further comprises:
a plurality of cavity holes debossed into a top surface of the vapor chamber support layer and having edges supporting the piezoelectric elements to allow deformation of the piezoelectric elements into the cavity holes.

18. The integrated heat dissipation system of claim 15, wherein the piezoelectric keyboard assembly further comprises:
a hydrophobic material layer disposed between a coversheet of the haptic piezoelectric keyboard assembly and a top surface of the C-cover having a lattice through which key pedestals of the keys are disposed.

19. The integrated heat dissipation system of claim 15, wherein the piezoelectric keyboard assembly further comprises:
a layer of phase-change material disposed between the contact foil layer and a coversheet of the piezoelectric keyboard assembly.

20. The integrated heat dissipation system of claim 15, wherein the piezoelectric keyboard assembly further comprises:
a heat dissipating fin structure thermally coupled to the vapor chamber support layer near an edge of the base chassis; and
a fan to exhaust heat from the heat dissipating fan structure from the base chassis.

* * * * *